(12) United States Patent
Taguchi

(10) Patent No.: US 8,440,374 B2
(45) Date of Patent: May 14, 2013

(54) COLORED CURABLE COMPOSITION, COLOR FILTER AND METHOD OF PRODUCING THE SAME, AND SOLID-STATE IMAGING DEVICE

(75) Inventor: Hiroshi Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 287 days.

(21) Appl. No.: 12/999,018

(22) PCT Filed: Sep. 17, 2009

(86) PCT No.: PCT/JP2009/066252
§ 371 (c)(1),
(2), (4) Date: Dec. 14, 2010

(87) PCT Pub. No.: WO2010/038625
PCT Pub. Date: Apr. 8, 2010

(65) Prior Publication Data
US 2011/0102662 A1 May 5, 2011

(30) Foreign Application Priority Data
Sep. 30, 2008 (JP) ................................. 2008-253152

(51) Int. Cl.
*G02B 5/20* (2006.01)
(52) U.S. Cl.
USPC ............................. 430/7; 430/270.1; 257/440
(58) Field of Classification Search .................. None
See application file for complete search history.

(56) References Cited

U.S. PATENT DOCUMENTS

| | | | |
|---|---|---|---|
| 4,698,099 A | 10/1987 | Nakamura et al. | |
| 4,704,165 A | 11/1987 | Nakamura et al. | |
| 5,130,463 A | 7/1992 | Haubennestel et al. | |
| 5,800,952 A | 9/1998 | Urano et al. | |

FOREIGN PATENT DOCUMENTS

| | | | |
|---|---|---|---|
| JP | 61-192727 A | 8/1986 |
| JP | 61-266472 A | 11/1986 |
| JP | 2-181704 A | 7/1990 |
| JP | 2-199403 A | 8/1990 |
| JP | 3-112992 A | 5/1991 |
| JP | 5-273411 A | 10/1993 |
| JP | 7-140654 A | 6/1995 |
| JP | 9-227635 A | 9/1997 |
| JP | 11-258415 A | 9/1999 |
| JP | 2001-164142 A | 6/2001 |
| JP | 2005-316388 A | 11/2005 |
| JP | 2007-171853 A | 7/2007 |
| WO | WO 2009/035189 A1 * | 3/2009 |

OTHER PUBLICATIONS

Computer-generated transaltion of JP 11-258415 (Sep. 1999).*
Computer-generated translation of JP JP 2007-171853 (Jul. 2007).*

* cited by examiner

*Primary Examiner* — John A. McPherson
(74) *Attorney, Agent, or Firm* — Sughrue Mion, PLLC

(57) ABSTRACT

A colored curable composition with which a coating film having excellent uniformity and surface planarity can be formed even when the support (substrate) has irregularities, and which exhibits excellent developability, and which is capable of forming a high-resolution colored pattern, is provided. The colored curable composition includes: (A) a polymer that contains a structural unit having a carboxyl group bonded to a main chain thereof via a linking group containing an ester group; (B) a photopolymerization initiator; (C) a polymerizable compound; (D) a pigment; and (E) a dispersant containing a phosphoric acid group.

15 Claims, 1 Drawing Sheet

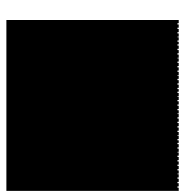 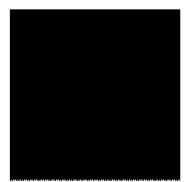 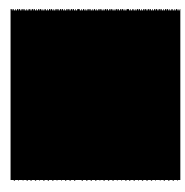
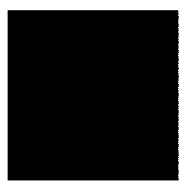 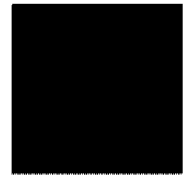 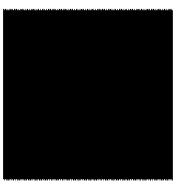
 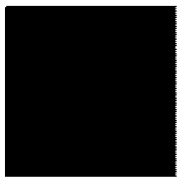 

COLORED CURABLE COMPOSITION, COLOR FILTER AND METHOD OF PRODUCING THE SAME, AND SOLID-STATE IMAGING DEVICE

TECHNICAL FIELD

The present invention relates to a colored curable composition, a color filter and a method of producing the same, and a solid-state imaging device.

BACKGROUND ART

Color filters are essential components of liquid crystal displays and solid-state imaging devices. A color filter is composed of colored patterns of plural hues, and usually has at least colored regions of red, green, and blue (hereinafter referred to as "colored patterns" or "colored pixels"). A method of forming the colored regions includes: applying a curable composition containing a coloring agent of any one of red, green, or blue as a first hue (hereinafter also referred to as a "first color"); conducting exposure to light, development, and, optionally, heating treatment, thereby forming a colored pattern of the hue; and repeating similar processes of applying, exposing to light, development, and, optionally, heating treatment, for a second hue (hereinafter also referred to as a "second color") and a third color (hereinafter also referred to as a "third color").

Formation methods like that described above are called photolithographic methods or pigment dispersion methods. Negative photosensitive compositions in which a photopolymerizable monomer and a photopolymerization initiator are added to an alkali-soluble resin are proposed as photosensitive compositions to be used in the formation methods (see, for example, Japanese Patent Application Laid-Open (JP-A) No. 2-181704, JP-A No. 2-199403, JP-A No. 5-273411, and JP-A No. 7-140654.

DISCLOSURE OF THE INVENTION

Problem to be Solved by the Invention

These days, formation of a fine colored pattern (for example, a colored pattern of which one side has a length of 1.7 μm or less) with high reproducibility is demanded in both of liquid crystal displays and solid-state imaging devices, aiming at improving resolution. At the same time, reduction of the film thickness of the colored pattern (to, for example, 1 μm or less) is demanded.

In a case in which a fine image like the above is formed in the first hue, and similar image formation is thereafter conducted for the second and subsequent hues, a colored curable composition is applied to a substrate having a colored pattern thereon and having irregularities. In this case, the application onto the irregularities on the substrate lowers the uniformity of the surface of the resultant colored curable composition layer due to the irregularities on the substrate, and thus generates coating unevenness in the form of irregularities. In a case in which exposure to light and development are conducted with such thickness unevenness, the planarity of the surface of the image reduces, and development unevenness occurs, as a result of which desired high-resolution image formation is difficult.

In order to increase the uniformity in a case in which colored curable composition layers for the second and subsequent colors are formed on a substrate surface on which a fine colored pattern has been formed, a method of adding additives, such as various surfactants, to the colored curable compositions may be employed. However, when only this method is employed, the uniformity of the coating film may not be sufficient for the formation of multi-color high-resolution patterns having a minute area such as having a length of one side of 1.7 μm or less.

As described above, in colored curable compositions, a curable composition useful for forming a colored pattern of a color filter (particularly, a color filter for a solid-state imaging device) with which a coating film having excellent smoothness and uniformity can be formed even on a substrate surface having irregularities, and which exhibits excellent developability, and which is suitable for forming an image having a minute area, is desired.

The present invention has been made in view of the above. Objects of the invention are described below.

Specifically, an aspect of the invention provides a colored curable composition (particularly, a colored curable composition useful for forming a colored pattern of a color filter) with which a coating film having excellent uniformity and surface planarity can be formed even when the support (substrate) has irregularities, and which exhibits excellent developability, and which is capable of forming a high-resolution colored pattern.

Another aspect of the invention provides a color filter having a high-resolution colored pattern, a method of producing the same, and a solid-state imaging device having a color filter having excellent color characteristics.

Means for Solving the Problem

As a result of extensive study, the inventor of the present invention has found that the above objects can be achieved by using a polymer having a specific side chain structure and a dispersant having a specific structure together, and thus completed the invention.

That is, specific means in the invention are as follows.

<1> A colored curable composition including: (A) a polymer that contains a structural unit having a carboxyl group bonded to a main chain thereof via a linking group containing an ester group; (B) a photopolymerization initiator; (C) a polymerizable compound; (D) a pigment; and (E) a dispersant containing a phosphoric acid group.

<2> A colored curable composition as described in <1>, wherein the (A) polymer that contains a structural unit having a carboxyl group bonded to a main chain thereof via a linking group containing an ester group is a polymer containing a structural unit represented by the following Formula (I):

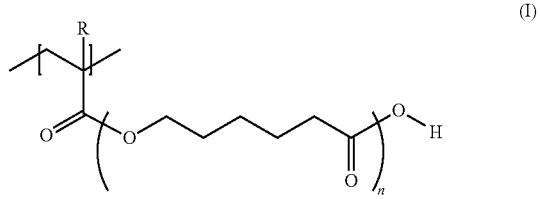

in Formula (I), R represents a hydrogen atom or a hydrocarbon group having from 1 to 4 carbon atoms, and n represents an integer of from 1 to 200.

<3> A colored curable composition as described in <2>, wherein R in the above Formula (I) is a hydrogen atom or a methyl group.

<4> A colored curable composition as described in <2> or <3>, wherein n in the above Formula (I) is an integer of from 1 to 100.
<5> A colored curable composition as described in any one of <2> to <4>, wherein the structural unit represented by the above Formula (I) is contained, at a content of from 5% by mass to 100% by mass, in the (A) polymer that contains a structural unit having a carboxyl group bonded to a main chain thereof via a linking group containing an ester group.
<6> A colored curable composition as described in any one of <2> to <5>, wherein the (A) polymer that contains a structural unit having a carboxyl group bonded to a main chain thereof via a linking group containing an ester group further includes a structural unit other than structural units represented by the above Formula (I).
<7> A colored curable composition as described in any one of <1> to <6>, wherein the content of the (A) polymer that contains a structural unit having a carboxyl group bonded to a main chain thereof via a linking group containing an ester group is from 2% by mass to 50% by mass relative to the solids content of the colored curable composition.
<8> A colored curable composition as described in any one of <1> to <7>, wherein the (E) dispersant containing a phosphoric acid group is a compound represented by the following Formula (II):

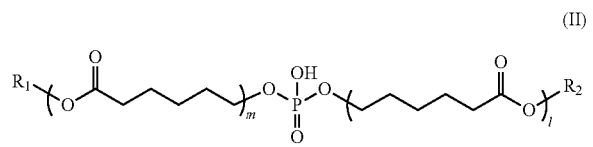

(II)

in Formula (II), $R_1$ and $R_2$ each independently represent a hydrogen atom or a hydrocarbon group having from 1 to 20 carbon atoms, and m and/each independently represent an integer of from 1 to 200.
<9> A colored curable composition as described in <8>, wherein $R_1$ and $R_2$ in the above Formula (II) are each independently a hydrocarbon group having from 6 to 20 carbon atoms.
<10> A colored curable composition as described in <8> or <9>, wherein m and l in the above Formula (II) are each independently an integer of from 2 to 20.
<11> A colored curable composition as described in any one of <1> to <10>, wherein the (C) polymerizable compound is a radical-polymerizable compound.
<12> A colored curable composition as described in any one of <1> to <11>, wherein the (D) pigment and the (E) dispersant containing a phosphoric acid group are prepared in the form of a pigment dispersion liquid, and the amount of the (E) dispersant containing a phosphoric acid group in the pigment dispersion liquid is from 0 to 100 parts by mass relative to 100 parts by mass of the (D) pigment.
<13> A colored curable composition as described in any one of <1> to <12>, wherein the (D) pigment is contained, at a content of from 5% by mass to 90% by mass, in the colored curable composition.
<14> A color filter produced using the colored curable composition of any one of <1> to <13>.
<15> A method of producing a color filter, the method including:
forming a colored layer by applying the colored curable composition of any one of <1> to <13> onto a support;
exposing the colored layer to light; and
developing the colored layer after the exposure to light.

<16> A method of producing a color filter as described in <15>, wherein the forming of the colored layer comprises forming the colored layer by applying, onto a colored pattern formation side of the support on which at least a colored pattern for a n-th color (n representing an integer of 1 or greater) is formed, at least one of the colored curable composition for forming at least one colored pattern for a (n+1)-th color (n representing an integer of 1 or greater) and subsequent colors if any, such that the at least one colored curable composition is superposed on the already-formed colored pattern.
<17> A solid-state imaging device including the color filter of <14>.

Effect of the Invention

According to an aspect of the invention, a colored curable composition, particularly a colored curable composition useful for forming a colored pattern of a color filter, is provided with which a coating film having excellent uniformity and surface planarity can be formed even when the support (substrate) has irregularities thereon, and which has excellent developability, and which is capable of forming a high-resolution colored pattern.

According to another aspect of the invention, a color filter having a high-resolution colored pattern, a method of producing the same, and a solid-state imaging device having a color filter having excellent color characteristics are provided.

BRIEF DESCRIPTION OF THE DRAWINGS

FIG. 1 is a plan view showing the shape of a first colored pattern formed on a substrate in Examples.

BEST EMBODIMENT FOR CARRYING OUT THE INVENTION

Colored Curable Composition

The colored curable composition of the invention includes (A) a polymer that contains a structural unit having a carboxyl group bonded to a main chain thereof via a linking group containing an ester group; (B) a photopolymerization initiator; (C) a polymerizable compound; (D) a pigment; and (E) a dispersant containing a phosphoric acid group.

The components of the colored curable composition of the invention are sequentially described below.

(A) Polymer that Contains Structural Unit Having Carboxyl Group Bonded to Main Chain Thereof Via Linking Group Containing Ester Group The colored curable composition of the invention includes at least one type of (A) polymer that contains a structural unit having a carboxyl group bonded to a main chain thereof via a linking group containing an ester group (hereinafter also referred to as "(A) specific polymer").

The structural unit having a carboxyl group bonded to the main chain via a linking group containing an ester group is preferably a structural unit represented by the following Formula (I).

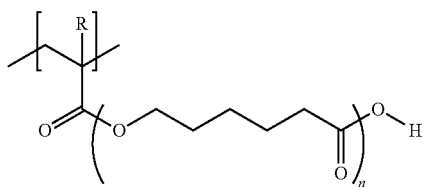

(I)

In Formula (I), R represents a hydrogen atom or a hydrocarbon group having from 1 to 4 carbon atoms, preferably a hydrogen atom or a methyl group, and most preferably a hydrogen atom or a methyl group.

n represents an integer of from 1 to 200. The properties of the polymer, such as acid value, crystallinity, and coating film properties, can be controlled by the number, n. From this viewpoint, n is preferably an integer of from 1 to 100, and more preferably an integer of from 2 to 20. When n is 200 or smaller, developability improves.

The (A) specific polymer in the invention preferably includes structural units represented by Formula (I) at a proportion of from 5% by mass to 100% by mass, and more preferably from 20% by mass to 70% by mass, relative to the polymer.

It is preferable that the (A) specific polymer includes a structural unit other than the above structural unit, since various physical characters can be imparted to the polymer thereby. Specifically, control of the types and amounts of coexisting other copolymerization units enables control of the molecular weight, hydrophilicity/hydrophobicity, and polarity of the specific polymer.

The another copolymerization component that the (A) specific polymer according to the invention optionally includes is not limited, and examples of copolymerizable structural units include the following:

(1) acrylic esters having an aliphatic hydroxyl group and methacrylic esters having an aliphatic hydroxyl group, such as 2-hydroxyethyl acrylate or 2-hydroxyethyl methacrylate;

(2) acrylates such as methyl acrylate, ethyl acrylate, propyl acrylate, butyl acrylate, hexyl acrylate, amyl acrylate, decyl acrylate, octyl acrylate, 2-ethylhexyl acrylate, dodecyl acrylate, tetradecyl acrylate, stearyl acrylate, benzyl acrylate, 2-chloroethyl acrylate, glycidyl acrylate, N-dimethylaminoethyl acrylate, polyethyleneglycol monoacrylate, polypropyleneglycol monoacrylate, methoxybenzyl acrylate, furfuryl acrylate, tetrahydrofurfuryl acrylate, and 2-phenylethyl acrylate;

(3) methacrylates such as methyl methacrylate, ethyl methacrylate, propyl methacrylate, butyl methacrylate, hexyl methacrylate, amyl methacrylate, decyl methacrylate, octyl methacrylate, 2-ethylhexyl methacrylate, dodecyl methacrylate, tetradecyl methacrylate, stearyl methacrylate, benzyl methacrylate, 2-chloroethyl methacrylate, glycidyl methacrylate, N-dimethylaminoethyl methacrylate, polyethyleneglycol monomethacrylate, polypropyleneglycol monomethacrylate, methoxybenzyl methacrylate, furfuryl methacrylate, tetrahydrofurfuryl methacrylate, and 2-phenylethyl methacrylate;

(4) acrylamides and methacrylamides, such as acrylamide, methacrylamide, N-methylolacrylamide, N-ethylacrylamide, N-hexylmethacrylamide, N-cyclohexylacrylamide, N-hydroxyethylacrylamide, n-phenylacrylamide, N-nitrophenylacrylamide, N-ethyl-N-phenylacrylamide, and acrylamido-2-methylpropanesulfonic acid;

(5) vinyl ethers such as ethyl vinyl ether, 2-chloro ethyl vinyl ether, hydroxyethyl vinyl ether, propyl vinyl ether, butyl vinyl ether, and phenyl vinyl ether;

(6) vinyl esters such as vinyl acetate, vinyl chloroacetate, vinyl butyrate, and vinyl benzoate;

(7) styrenic compounds such as styrene, α-methylstyrene, methylstyrene, and chloromethylstyrene;

(8) vinylketones such as methyl vinyl ketone, ethyl vinyl ketone, propyl vinyl ketone, and phenyl vinyl ketone;

(9) olefins such as ethylene, propylene, isobutylene, butadiene, and isoprene;

(10) N-vinylpyrrolidone, N-vinylcarbazole, 4-vinylpyridine, acrylonitrile, methacrylonitrile, etc.; and

(11) unsaturated imides such as maleimide, N-acryloylacrylamide, N-acetylmethacrylamide, N-propionylmethacrylamide, and N-(p-chlorobenzoyl)methacrylamide.

It is also possible to use, as a copolymerization component of a polymer containing a structural unit represented by Formula (I), a structural unit derived from an acid group-containing monomer having the structure of any one of the following (12) to (17). The content of the acid group-containing structural unit in the (A) specific polymer is preferably 30% by mol or lower from the viewpoint of effects.

(12) a phenol group (—Ar—OH)

(13) a sulfonamido group (—SO$_2$NH—R)

(14) an active imido group (—SO$_2$NHCOR, —SO$_2$NHSO$_2$R, —CONHSO$_2$R)

(15) a carboxylic acid group

(16) a sulfonic acid group (—SO$_3$H)

(17) a phosphoric acid group (—OPO$_3$H$_2$)

In the above (12) to (17), Ar represents a divalent aryl linking group that may have a substituent, and R represents a hydrogen atom or a hydrocarbon group that may have a substituent.

Examples of monomers having (12) a phenol group include acrylamide, methacrylamide, acrylic ester, or methacrylic ester, each of which has a phenol group, or hydroxystyrene.

Examples of monomers having (13) a sulfonamido group include a compound having, in a molecule thereof, at least one polymerizable unsaturated group and at least one sulfonamido group of which the structure is shown above. In particular, a low-molecular-weight compound having, within a molecule thereof, an acryloyl group, an allyl group, or a vinyloxy group, and a sulfonamido group is preferable. Examples thereof include the compounds represented by the following Formulae (i) to (v).

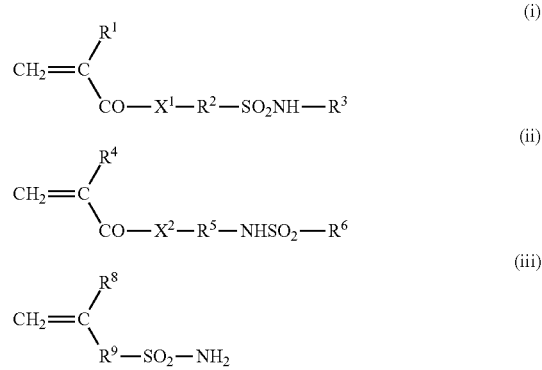

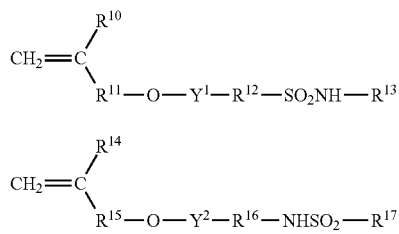

In Formulae (i) to (v), $X^1$ and $X^2$ each independently represent —O— or —$NR^7$—. $R^1$ and $R^4$ each independently represent a hydrogen atom or —$CH_3$. $R^2$, $R^5$, $R^9$, $R^{12}$, and $R^{16}$ each independently represent an alkylene group having from 1 to 12 carbon atoms, a cycloalkylene group, an arylene group, or an aralkylene group, each of which may have a substituent. $R^3$, $R^7$, and $R^{13}$ each independently represent a hydrogen atom, an alkyl group having from 1 to 12 carbon atoms, a cycloalkyl group, an aryl group, or an aralkyl group, each of which may have a substituent. $R^6$ and $R^{17}$ each independently represent an alkyl group having from 1 to 12 carbon atoms, a cycloalkyl group, an aryl group, or an aralkyl group, each of which may have a substituent. $R^8$, $R^{10}$, and $R^{14}$ each independently represent a hydrogen atom or —$CH_3$. $R^{11}$ and $R^{15}$ each independently represent a single bond, or an alkylene group having from 1 to 12 carbon atoms, a cycloalkylene group, an arylene group, or an aralkylene group, each of which may have a substituent. $Y^1$ and $Y^2$ each independently represent a single bond or —CO—.

Of the compounds represented by Formulae (i) to (v), particularly, a compound containing an acid group-containing structural unit derived from m-aminosulfonylphenyl methacrylate, N-(p-aminosulfonylphenyl)methacrylamide, N-(p-aminosulfonylphenyl)acrylamide, or the like is preferably used in the colored curable composition of the invention.

Examples of monomers having (14) an active imido group include a compound having, in a molecule thereof, at least one unsaturated polymerizable group and at least one active imido group represented by the above structural formula. In particular, a compound having, in a molecule thereof, at least one polymerizable unsaturated group and at least one active imido group represented by the following structural formula is preferable.

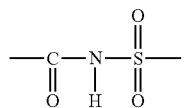

Specifically, an acid group-containing structural unit derived from N-(p-toluenesulfonyl)methacrylamide, N-(p-toluenesulfonyl)acrylamide, or the like can be suitably used.

Examples of monomers having (15) a carboxylic acid group include a compound having, in a molecule thereof, at least one carboxylic acid group and at least one polymerizable unsaturated group. Examples of monomers having (16) a sulfonic acid group include a compound having, in a molecule thereof, at least one sulfonic acid group and at least one polymerizable unsaturated group. Examples of monomers having (17) a phosphoric acid group include a compound having, in a molecule thereof, at least one phosphoric acid group and at least one polymerizable unsaturated group.

Further, the (A) specific polymer according to the invention may include a polymerizable group at a side chain, if necessary. For example, a polymer having a polymerizable group at a side chain can be obtained by allowing a polymer having the specific structure of the invention to react with a monomer having a polymerizable group and a cyclic ether structure, such as glycidyl methacrylate. The introduction of a polymerizable group to a side chain may alternatively be carried out by allowing a polymer having the specific structure of the invention to react with 2-methacryloyloxyethyl isocyanate, 2-acryloyloxyethyl isocyanate, or the like.

Particularly, in a case in which a polymer having the specific structure of the invention is allowed to react with an isocyanate, the polymer having the specific structure preferably includes, as a copolymerization component, a structural unit derived from a monomer having a hydroxyl group, such as 2-hydroxyethyl methacrylate or 2-hydroxyethyl acrylate.

The (A) specific polymer according to the invention has an acid value of preferably from 5 to 250 mgKOH/g, more preferably from 10 to 150 mgKOH/g, and still more preferably from 25 to 120 mgKOH/g. An acid value within the above range results in suppression of occurrence of pattern detachment at the time of development, and leads to favorable alkali develop ability.

In the invention, acid value can be calculated from, for example, the average content of acid groups in the resin molecule.

The acid value of the (A) specific polymer can be adjusted by changing the type or content of the acid group-containing structural unit.

In a case in which a pigment is used as a coloring agent, the (A) specific polymer according to the invention preferably includes a structural unit having an aromatic ring, from the viewpoints of dispersion stability of the pigment and stability of the colored curable composition.

Examples of the aromatic ring include: an aromatic hydrocarbon group such as a phenyl group, a naphthyl group, or an anthranyl group; and a heteroatom-containing aromatic group such as an indole group, an imidazole group, a triazole group, an oxydiazole group, a benzimidazole group, a benzoxazole group, a benzothiazole group, a pyridinyl group, a thiophene group, a pyrrole group, or a furanyl group. It is preferable that an aromatic ring such as those described above is directly bonded to a side chain of the specific polymer, or is bonded to a side chain of the specific polymer via a predetermined linking group.

The content of structural units having an aromatic group is preferably from 5% by mass to 80% by mass, and more preferably from 10% by mass to 60% by mass, relative to the (A) specific polymer.

The (A) specific polymer according to the invention to be used preferably has a weight average molecular weight of from 3,000 or more, and a number average molecular weight of 1,000 or more. The weight average molecular weight is more preferably from 5,000 to 500,000, more preferably from 10,000 to 100,000, and particularly preferably from 12,000 to 50,000. Such a polymer may be used singly, or in combination of two or more thereof. Here, weight average molecular weight and number average molecular weight are polystyrene-equivalent values determined by a gel permeation chromatography (GPC) method.

Since the colored curable composition of the invention includes the (A) specific polymer having, for example, a structure represented by Formula (I) at a side chain, the colored curable composition exhibits improved coating film flexibility and improved deformability for conforming to a shape. It is thought that, due to these effects, a uniform coating film can be formed therewith even when there are irregularities on the support (substrate) on which the colored curable composition is to be applied, and the film thickness of a later-formed colored pattern can be made uniform even in a case in which colored patterns of multiple colors are sequentially formed. In a preferable embodiment of the invention, introduction of an acid group into the (A) specific polymer improves the developability of the curable composition itself, suppresses generation of development residues even in the case of forming a fine pattern, and provides an advantage in that a pattern having a uniform film thickness and excellent resolution can be formed.

Therefore, the colored curable composition of the invention is particularly effective in the case of sequentially forming a high-resolution image, i.e., a minute image pattern, plural times, and is effective in the case of forming an image having a line width of 30 μm or less, more preferably 3 μm or less. Further, since the colored curable composition of the invention has excellent curability even when the amount of the polymerizable component is small, the colored curable composition of the invention is particularly effective in cases in which the content of pigment solids in the colored curable composition is 40% by mass or higher, and more preferably 45% by mass or higher.

Specific structures of the (A) specific polymer are shown below. However, the invention is not limited thereto.

In the present specification, "wt %" in structural formulae indicates "% by mass".

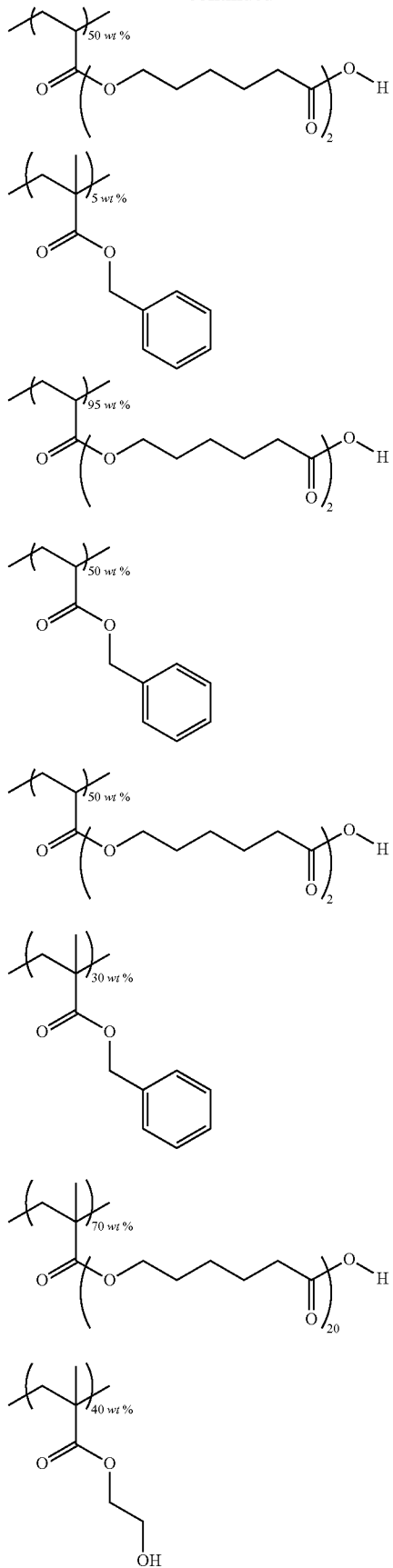

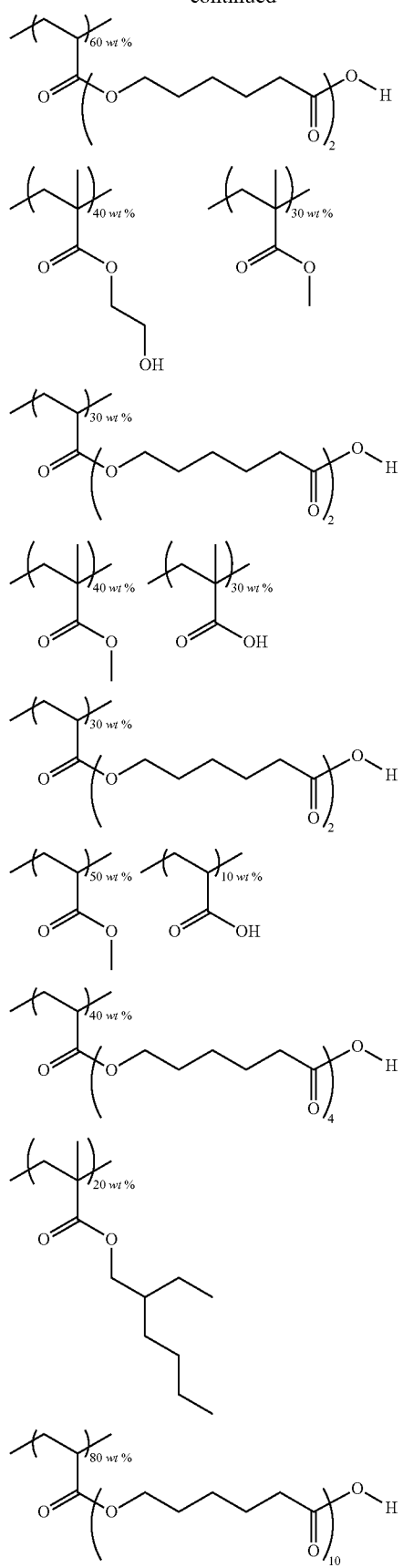
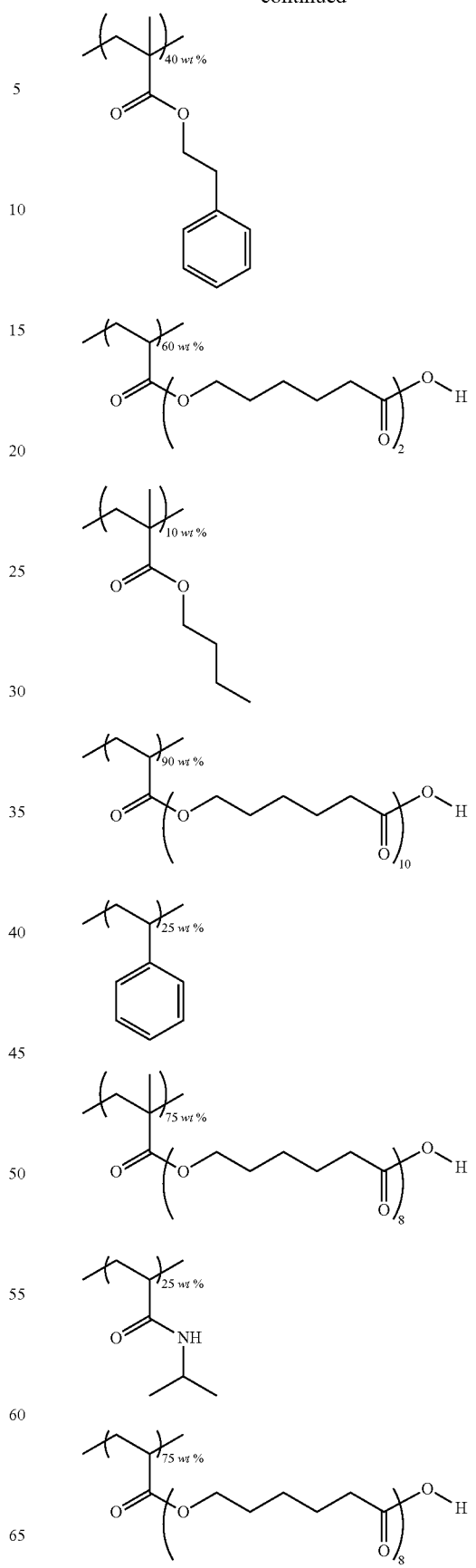

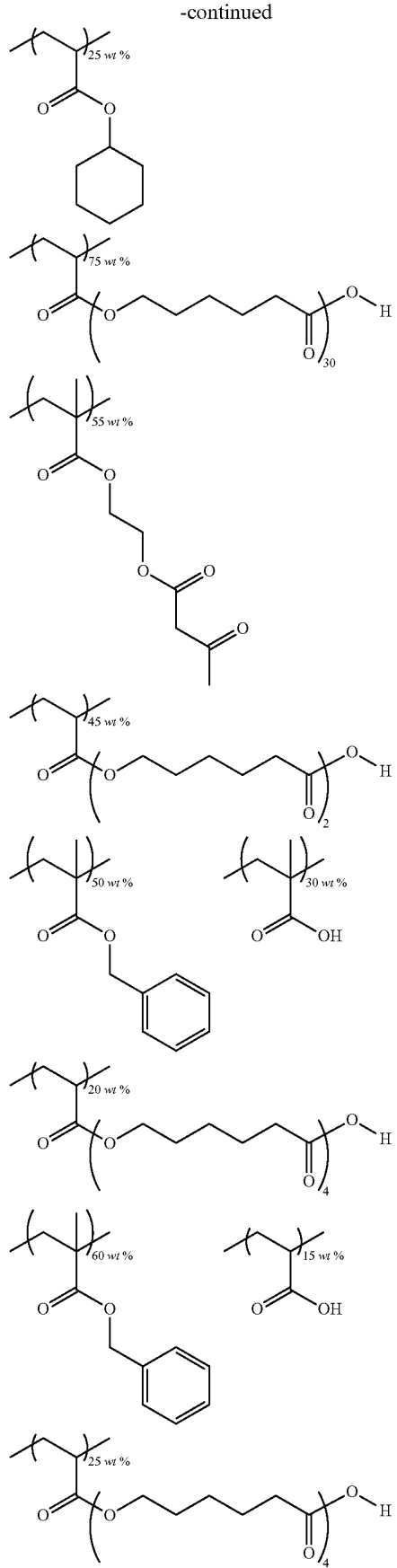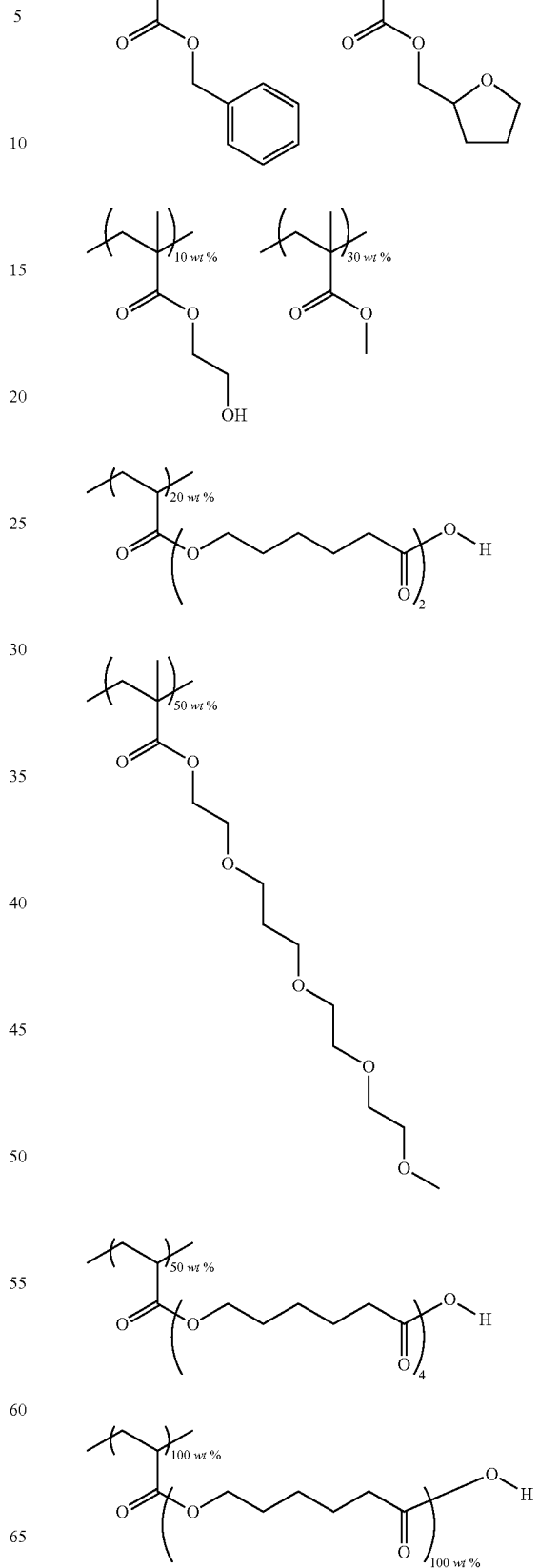

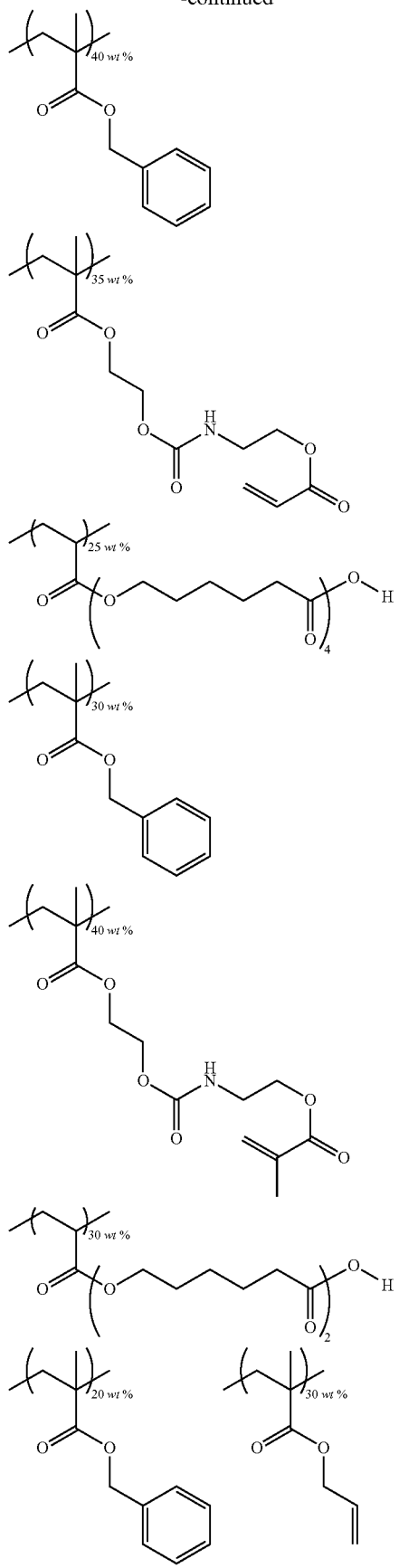
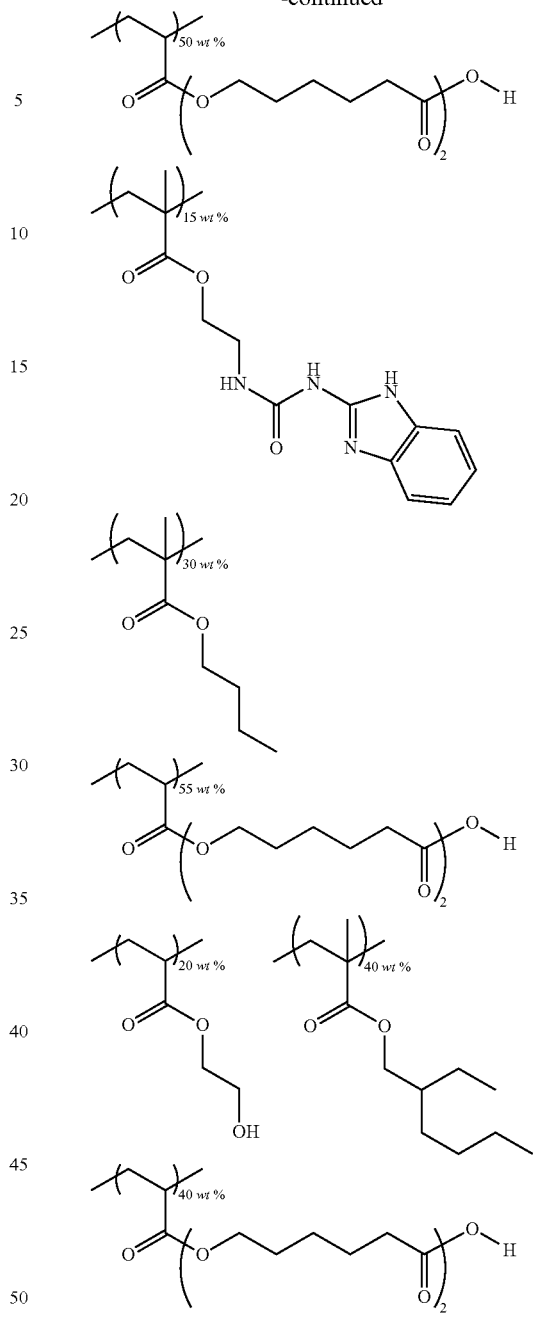

Among these, the specific polymer according to the invention preferably includes at least one structure represented by Formula (I) at a proportion of from 30% by mass to 70% by mass, from the viewpoint of the uniformity of the coating film. The specific polymer according to the invention has an acid value of preferably from 80 mgKOH/g to 150 mgKOH/g, from the viewpoint of developability. Regarding molecular weight, the weight average molecular weight of the specific polymer is preferably from 7,000 to 30,000 from the viewpoints of developability and the uniformity of the coating film.

The content of the (A) specific polymer in the colored curable composition of the invention is preferably from 2% by mass to 50% by mass, more preferably from 3% by mass to 40% by mass, and most preferably from 5% by mass to 30% by mass, relative to the solids content of the colored curable composition.

(B) Photopolymerization Initiator

The colored curable composition of the invention further includes (B) a photopolymerization initiator.

The (B) photopolymerization initiator in the invention is preferably a photopolymerization initiator that is decomposed by light to initiate and promote the polymerization of the specific polymerizable compound, and preferably has an absorption in a wavelength region of from 300 to 500 nm. The photopolymerization initiator may be used singly, or in combination of two or more thereof.

Examples of the photopolymerization initiator include an organic halogenated compound, an oxydiazole compound, a carbonyl compound, a ketal compound, a benzoin compound, an acridine compound, an organic peroxide compound, an azo compound, a coumarin compound, an azide compound, a metallocene compound, a hexaaryl biimidazole compound, an organic boric acid compound, a disulfonic acid compound, an oxime ester compound, an onium salt compound, and an acylphosphine (oxide) compound.

Specific examples of the organic halogenated compound include compounds described in, for example, Wakabayashi et al., *Bull Chem. Soc Japan* 42, 2924 (1969), U.S. Pat. No. 3,905,815, Examined Japanese Patent Application Publication (JP-B) No. 46-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, JP-A No. 63-298339, and M. P. Hutt, *Jurnal of Heterocyclic Chemistry* 1 (No. 3) (1970), particularly, an oxazole compound substituted by a trihalomethyl group or a s-triazine compound substituted by a trihalomethyl group.

A more preferable example of the s-triazine compound is a s-triazine derivative in which at least one monohalogen-substituted, dihalogen-substituted, or trihalogen-substituted methyl group is bonded to a s-triazine ring. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the oxydiazole compound include 2-trichloromethyl-5-styryl-1,3,4-oxadiazole, 2-trichloromethyl-5-(cyanostyryl)-1,3,4-oxadiazole, 2-trichloromethyl-5-(naphth-1-yl)-1,3,4-oxadiazole, and 2-trichloromethyl-5-(4-styryl)styryl-1,3,4-oxadiazole.

Examples of the carboyl compound include: benzophenone; benxophenone derivatives such as Michler's ketone, 2-methylbenzophenone, 3-methylbenzophenone, 4-methylbenzophenone, 2-chlorobenzophenone, 4-bromobenzophenone, and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl) ketone, and 2-benzyl-2-dimethylamino-4-morpholinobutyrophenone; thioxanthone derivatives such as thioxanthone, 2-ethylthioxanthone, 2-isopropylthioxanthone, 2-chlorothioxanthone, 2,4-dimethylthioxanthone, 2,4-diethylthioxanthone, and 2,4-diisopropylthioxanthone; and benzoic ester derivatives such as ethyl p-dimethylaminobenzoate and ethyl p-diethylaminobenzoate.

Examples of the ketal compound include benzyl methyl ketal and benzyl-β-methoxyethyl ethyl acetal.

Examples of the benzoin compound include m-benzoin isopropyl ether, benzoin isobutyl ether, benzoin methyl ether, and methyl o-benzoyl benzoate.

Examples of the acridine compound include 9-phenylacridine and 1,7-bis(9-acridinyl)heptane.

Examples of the organic peroxide compound include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy) butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxylaurate, 3,3',4,4'-tetra-(t-butyl peroxycarbonyl)benzophenone, 3,3',4,4'-tetra-(t-hexyl peroxycarbonyl)benzophenone, 3,3',4,4'-tetra-(p-isopropylcumyl peroxycarbonyl)benzophenone, carbonyl di(t-butyl peroxy dihydrogen diphthalate), and carbonyl di(t-hexyl peroxy dihydrogen diphthalate).

Examples of the azo compound include the azo compound described in JP-A No. 8-108621.

Examples of the coumarin compound include 3-methyl-5-amino-((s-triazine-2-yl)amino)-3-phenylcoumarin, 3-chloro-5-diethylamino-((s-triazine-2-yl)amino)-3-phenylcoumarin, and 3-butyl-5-dimethylamino-((s-triazine-2-yl)amino)-3-phenylcoumarin.

Examples of the azide compound include the organic azide compounds described in U.S. Pat. No. 2,848,328, U.S. Pat. No. 2,852,379, and U.S. Pat. No. 2,940,853, and 2,6-bis(4-azidobenzylidene)-4-ethylcyclohexanone (BAC-E).

Examples of the metallocene compound include: various titanocene compounds described in JP-A No. 59-152396, JP-A No. 61-151197, JP-A No. 63-41484, JP-A No. 2-249, JP-A No. 2-4705, and JP-A No. 5-83588, such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methylcyclopentadienyl-Ti-bis-2,4,6-trifluorophen-1-yl, di-methylcyclopentadienyl-Ti-bis-2,3,5,6-tetrafluorophen-1-yl, and di-methylcyclopentadienyl-Ti-bis-2,3,4,5,6-pentafluorophen-1-yl; and iron-arene complexes described in JP-A No. 1-304453 and JP-A No. 1-152109.

Examples of the hexaaryl biimidazole compound include various compounds described in JP-B No. 6-29285, U.S. Pat. No. 3,479,185, U.S. Pat. No. 4,311,783, and U.S. Pat. No. 4,622,286. Specific examples thereof include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, and 2,2'-bis(o-trifluorophenyl)-4,4', 5,5'-tetraphenyl biimidazole.

Specific examples of the organic boric acid compound include: organic boric acid salts described in, for example, JP-A No. 62-143044, JP-A No. 62-150242, JP-A No. 9-188685, JP-A No. 9-188686, JP-A No. 9-188710, JP-A No. 2000-131837, JP-A No. 2002-107916, Japanese Patent No. 2764769, JP-A No. 2002-116539, and Kunz, Martin, *Rad Tech '98. Proceeding Apr.* 19-22, 1998, Chicago; organic boron sulfonium complexes or organic boron oxosulfonium complexes described in JP-A No. 6-157623, JP-A No. 6-175564, and JP-A No. 6-175561; organic boron iodonium complexes described in JP-A No. 6-175554 and JP-A No. 6-175553; organic boron phosphonium complexes described in JP-A No. 9-188710; and organic boron transition metal coordination complexes described in, for example, JP-A No. 6-348011, JP-A No. 7-128785, JP-A No. 7-140589, JP-A No. 7-306527, and JP-A No. 7-292014.

Examples of the disulfone compound include compounds described in, for example, JP-A No. 61-166544 and JP-A No. 2002-328465.

Examples of the oxime ester compound include compounds described in J.C.S. Perkin II (1979) 1653-1660, J.C.S. Perkin II (1979) 156-162, *Journal of Photopolymer Science and Technology* (1995) 202-232, and JP-A No. 2000-66385, and compounds described in JP-A No. 2000-80068 and JP-A No. 2004-534797.

Examples of the onium salt compound include diazonium salts described in S. I. Schlesinger, Photogr, Sci, Eng., 18, 387 (1974) and T. S. Bal et al, Polymer, 21, 423 (1980), ammonium salts described in U.S. Pat. No. 4,069,055 and JP-A No. 4-365049, phosphonium salts described in U.S. Pat. No. 4,069,055 and U.S. Pat. No. 4,069,056, and iodonium salts described in European Patent No. 104,143, JP-A No. 2-150848 and JP-A No. 2-296514.

An iodonium salt suitable for use in the invention is a diaryl iodonium salt, which is preferably substituted by two or more electron-donating groups, such as an alkyl group, an alkoxy group, or an aryloxy group, from the viewpoint of stability.

Examples of sulfonium salts that are preferable for use in the invention include the sulfonium salts described in European Patent No. 370,693, European Patent No. 390,214, European Patent No. 233,567, European Patent No. 297,443, European Patent No. 297,442, U.S. Pat. No. 4,933,377, U.S. Pat. No. 4,760,013, U.S. Pat. No. 4,734,444, U.S. Pat. No. 2,833,827, German Patent No. 2,904,626, German Patent No. 3,604,580, and German Patent No. 3,604,581, and the sulfonium salts are preferably substituted by an electron-withdrawing group from the viewpoint of stability and sensitivity. The electron-withdrawing group has a Hammett's value of preferably 0 or greater. Examples of preferable electron-withdrawing group include a halogen atom and a carboxylic acid.

Examples of other preferable sulfonium salts include a sulfonium salt in which a substituent of a triarylsulfonium salt has a coumarin structure or an anthraquinone structure, and which has an absorption at 300 nm or longer. Another preferable sulfonium salt is a sulfonium salt that is a triarylsulfonium salt which has an aryloxy group or an arylthio group as a substituent, and which has an absorption at 300 nm or longer.

Examples of the onium salt compound include the selenonium salt described in J. V. Crivello et al, *Macromolecules*, 10(6), 1307 (1977) and J. V. Crivello et al, *J. Polymer Sci., Polymer Chem. Ed.*, 17, 1047 (1979), and the arsonium salts described in C. S. Wen et al, *Teh, Proc. Conf Rad. Curing ASIA*, p 478, Tokyo, October (1988).

Examples of the acylphosphine (oxide) compound include IRGACURE (tradename, the same applies hereinafter) 819, DAROCUR (tradename, the same applies hereinafter) 4265, and DAROCUR TPO, all manufactured by Ciba Specialty Chemicals Inc.

From the viewpoint of exposure sensitivity, the (B) photopolymerization initiator used in the invention is preferably a compound selected from the group consisting of trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium salt, a benzothiazole compound, a benzophenone compound, an acetophenone compound and derivatives thereof, a cyclopentadiene-benzene-iron complex and salts thereof, a halomethyloxadiazole compound, and a 3-aryl-substituted coumarin compound.

The photopolymerization initiator is more preferably a trihalomethyltriazine compound, an α-aminoketone compound, an acylphosphine compound, a phosphine oxide compound, an oxime compound, a triarylimidazole dimer, an onium salt, a benzophenone compound, or an acetophenone compound, and most preferably at least one compound selected from the group consisting of a trihalomethyltriazine compound, an α-aminoketone compound, an oxime compound, a triarylimidazole dimer, and a benzophenone compound.

In a case in which the invention is employed in, particularly, solid-state imaging devices, generation of hydrochloric gas or the like during light exposure using an i-line stepper is unfavorable. Therefore, in a case in which the invention is practiced under such conditions, oxime compounds, which do not generate chlorine gas by light exposure and has excellent sensitivity, are preferable.

Usually, sufficient curability is not obtained in a case in which a thin film is formed, for reasons such as: a photopolymerization initiator for generating radicals cannot be added in a large amount due to high pigment concentration, and the concentrations of sensitizing agent and photopolymerization initiator are low due to high pigment concentration even in an initiation mechanism involving electron transfer and energy transfer using a sensitizer. In a case in which the curable composition of the invention is used to produce a solid-state imaging device in particular, a photopolymerization initiator that generates a halogen when exposed to light, such as triazine, cannot be used from the viewpoint of preventing staining of the light source. In consideration of these conditions, oxime compounds, which are broadly compatible to light sources of 300 nm or longer and are directly decomposed by light, are preferable. The combination of the (A) specific polymer and an oxime compound as the (B) photopolymerization initiator is more effective particularly in a curable composition which contains pigment at 30% by mass or higher, particularly 40% or higher, relative to the total solids content of the curable composition, and in which the proportion of polymerizable components is low.

Oxime compounds that can be used in the invention are not particularly limited as long as the compounds have a —C=N—O— bond. A compound represented by the following Formula (1) or Formula (2) (hereinafter also referred to as "specific oxime compound") is preferable.

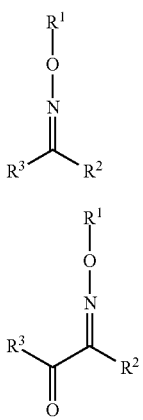

Formula (1)

Formula (2)

In Formula (1) and Formula (2), $R^1$ is a monovalent organic group, which preferably has a carbonyl group or a sulfo group. $R^1$ is preferably a group represented by Formula (3) or a group represented by Formula (4) from the viewpoints of sensitivity and stability.

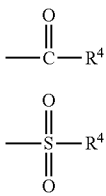

Formula (3)

Formula (4)

In Formula (3) and Formula (4), $R^4$ is a monovalent organic group, which is, for example, a monovalent organic group having from 1 to 20 carbon atoms. Examples of the organic group include an alkyl group, an alkenyl group, an alkynyl group, a cycloalkyl group, a cycloalkenyl group, a cycloalkynyl group, an aryl group, a heterocyclyl group, and an alkoxy group, each of which may be substituted by a halogen atom, a hydroxyl group, an alkyl group, an alkenyl group, an alkynyl group, a cycloalkyl group, a cycloalkenyl group, a cycloalkynyl group, an aryl group, a heterocyclyl group, a cyano group, an alkoxy group, an aryloxy group, a thioalkoxy group, a thioaryloxy group, a carboxyl group, an alkoxycarbonyl group, a sulfo group, a sulfonamido group, a urea group, a thiourea group, an amino group, an amido group, a carbonyl group, a nitro group, or a substituent having any of these groups.

From the viewpoints of stability over time, sensitivity, and productivity, a compound which is represented by Formula (3) and in which $R^4$ represents an alkyl group or an aryl group is most preferable.

In Formula (1) and Formula (2), $R^2$ is a hydrogen atom or a monovalent organic group, which is, for example, a monovalent organic group having from 1 to 20 carbon atoms. Examples of the organic group include an alkyl group, an alkenyl group, an alkynyl group, a cycloalkyl group, a cycloalkenyl group, a cycloalkynyl group, an aryl group, a heterocyclyl group, and an alkoxy group, each of which may be substituted by a halogen atom, a hydroxyl group, an alkyl group, an alkenyl group, an alkynyl group, a cycloalkyl group, a cycloalkenyl group, a cycloalkynyl group, a cyano group, an aryl group, a heterocyclyl group, an alkoxy group, an aryloxy group, a thioalkoxy group, a thioaryloxy group, a carboxyl group, an alkoxycarbonyl group, a sulfo group, a sulfonamido group, a urea group, a thiourea group, an amino group, an amido group, a carbonyl group, a nitro group, or a substituent having any of these groups.

In Formula (1) and Formula (2), $R^3$ is a monovalent organic group, which is, for example, a monovalent organic group having from 1 to 20 carbon atoms. Examples of the organic group include an alkyl group, an alkenyl group, an alkynyl group, a cycloalkyl group, a cycloalkenyl group, a cycloalkynyl group, an aryl group, a heterocyclyl group, and an alkoxy group, each of which may be substituted by a halogen atom, a hydroxyl group, an alkyl group, an alkenyl group, an alkynyl group, a cycloalkyl group, a cycloalkenyl group, a cycloalkynyl group, an aryl group, a cyano group, a heterocyclyl group, an alkoxy group, an aryloxy group, a thioalkoxy group, a thioaryloxy group, a carboxyl group, an alkoxycarbonyl group, a sulfo group, a sulfonamido group, a urea group, a thiourea group, an amino group, an amido group, a carbonyl group, a nitro group, or a substituent having any of these groups.

From the viewpoint of sensitivity, $R^3$ in Formula (1) and Formula (2) is preferably an aryl group or a heterocyclyl group. When $R^3$ is an aryl group, the aryl group is preferably substituted by a substituent having a nitrogen atom or a sulfur atom. When $R^3$ is a heterocyclyl group, the heterocyclyl group preferably contains a nitrogen atom, an oxygen atom, or a sulfur atom.

Specific examples of compounds (specific oxime compounds) represented by Formula (1) or Formula (2) are shown below (OS-1 to OS-113). However, the invention is not limited thereto.

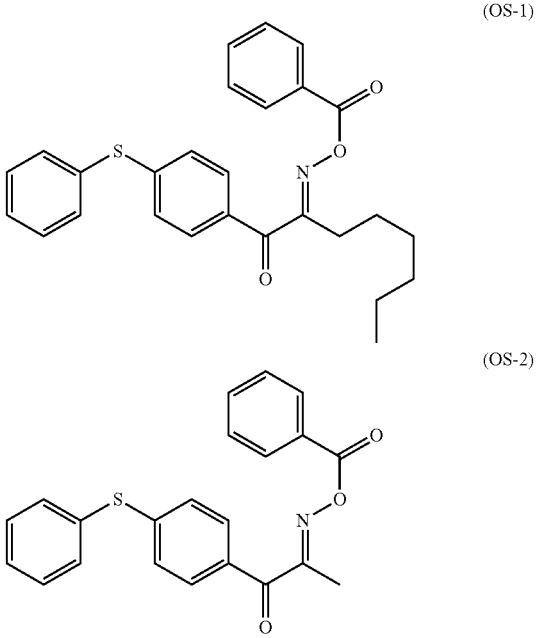

(OS-1)

(OS-2)

-continued
(OS-3)
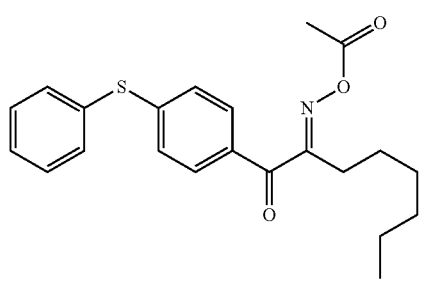
(OS-4)
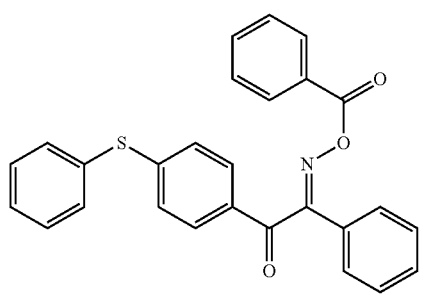
(OS-5)
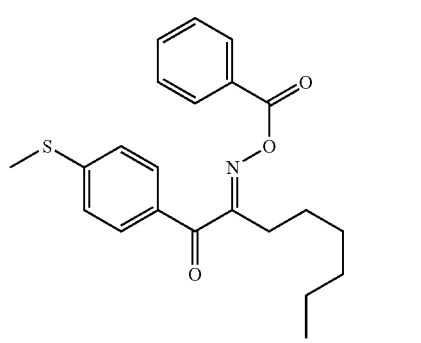
(OS-6)
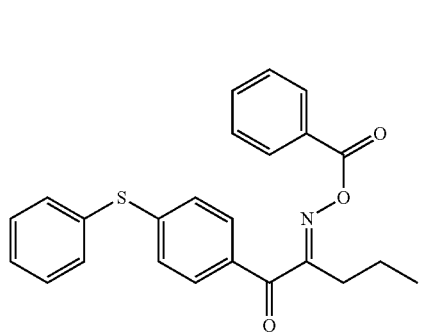
(OS-7)
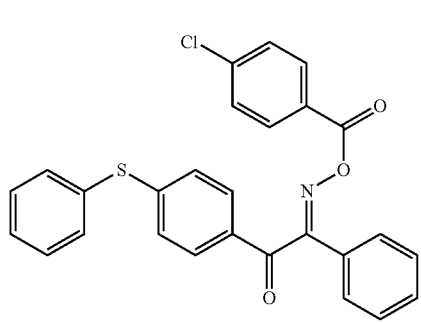
-continued
(OS-8)
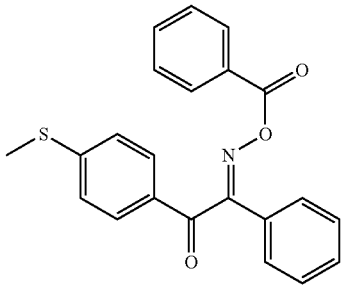
(OS-9)
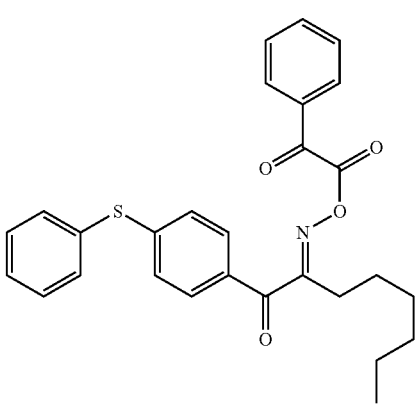
(OS-10)
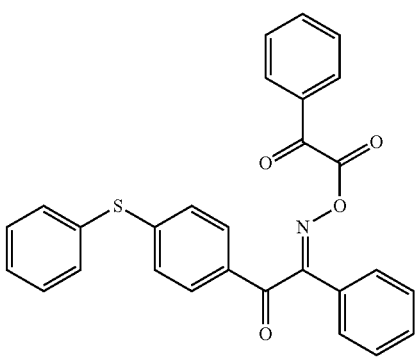
(OS-11)
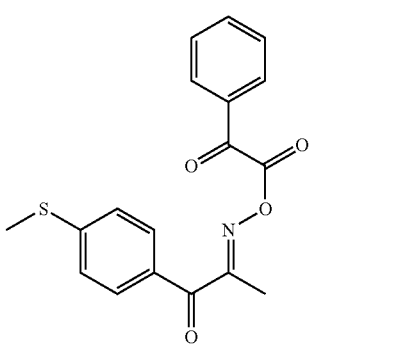

(OS-12)
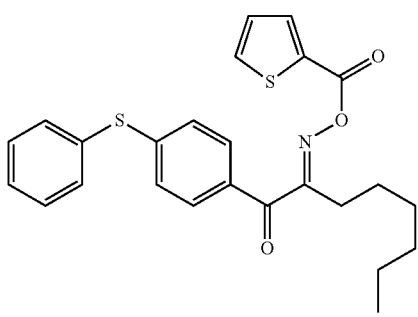
(OS-13)
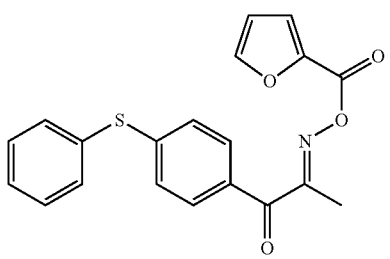
(OS-14)
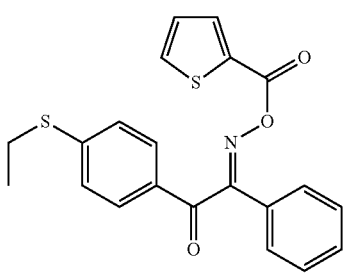
(OS-15)
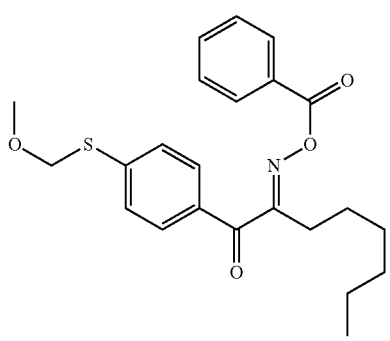
(OS-16)
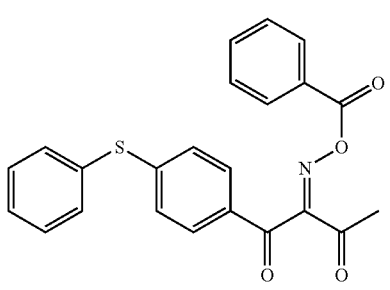
(OS-17)
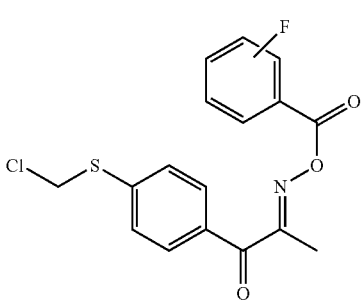
(OS-18)
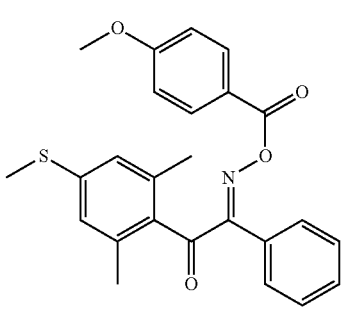
(OS-19)
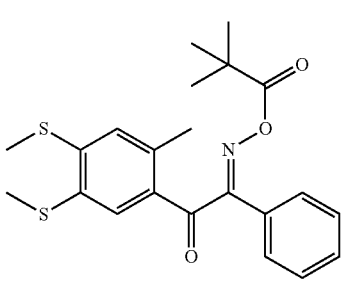
(OS-20)
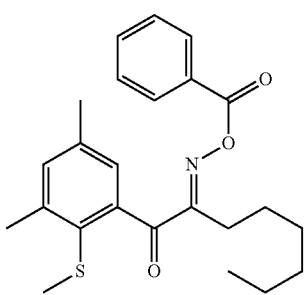
(OS-21)
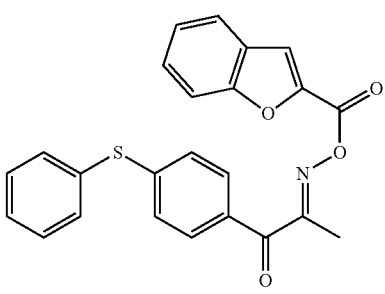

(OS-22)
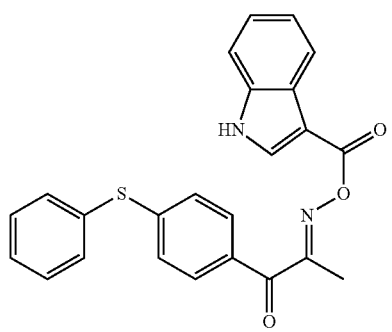
(OS-28)
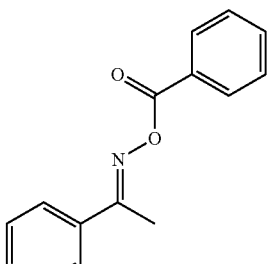
(OS-23)
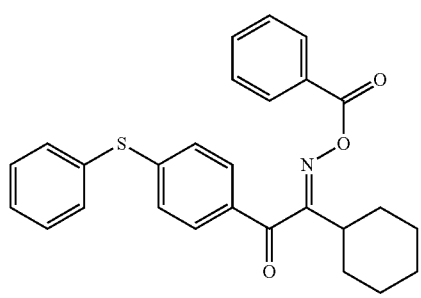
(OS-29)
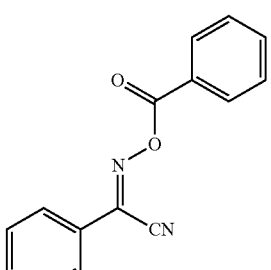
(OS-24)
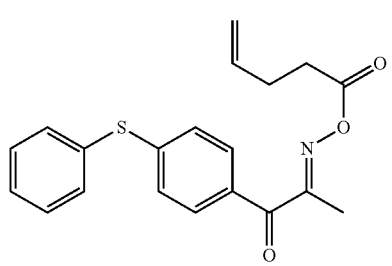
(OS-30)
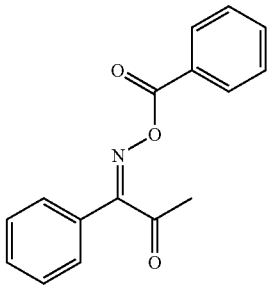
(OS-26)
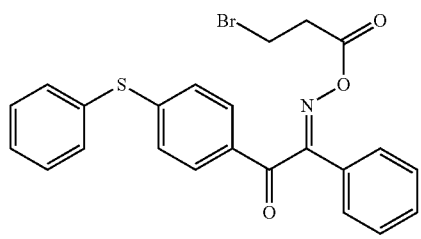
(OS-31)
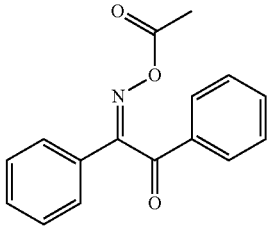
(OS-27)
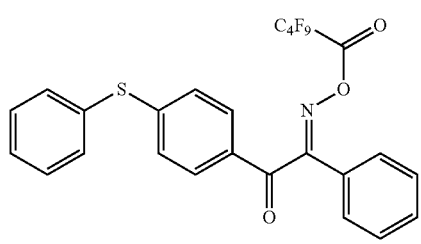
(OS-32)
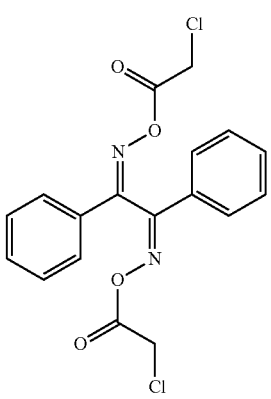

(OS-33)
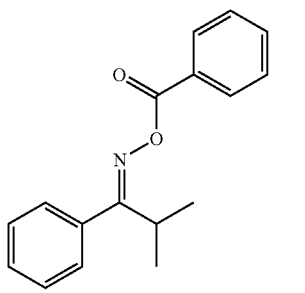
(OS-34)
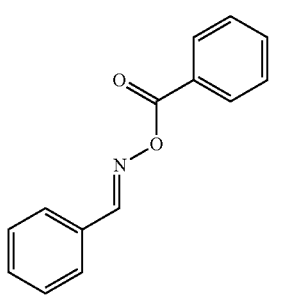
(OS-35)
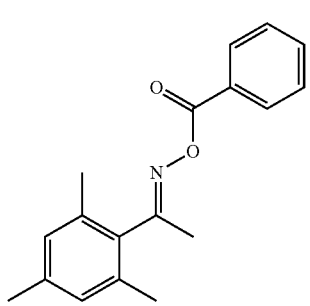
(OS-36)
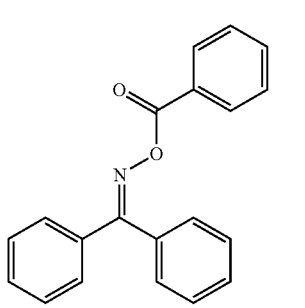
(OS-37)
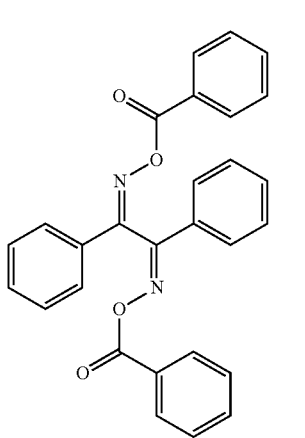
(OS-38)
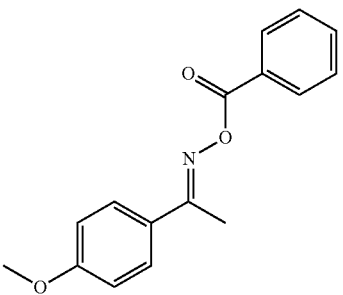
(OS-39)
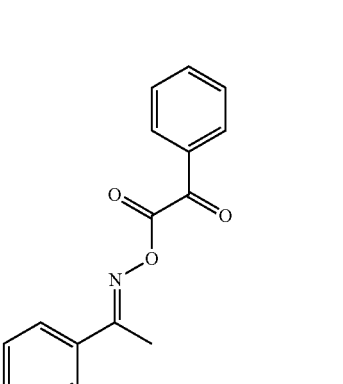
(OS-40)
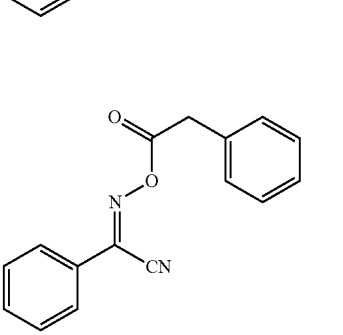
(OS-41)
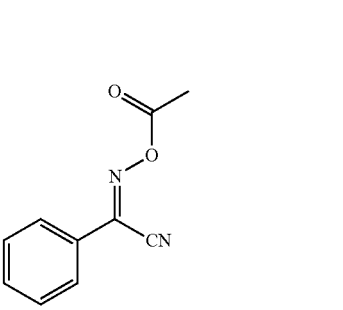
(OS-42)
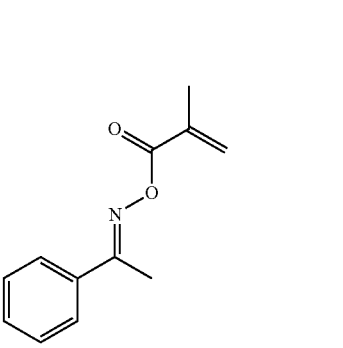

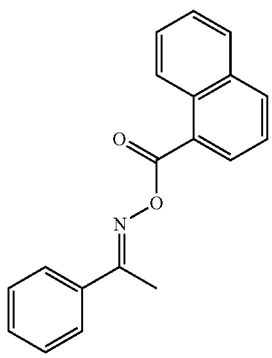
(OS-43)
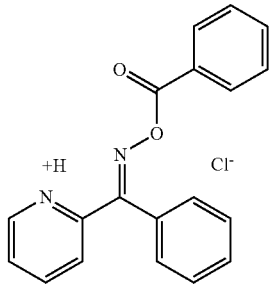
(OS-48)
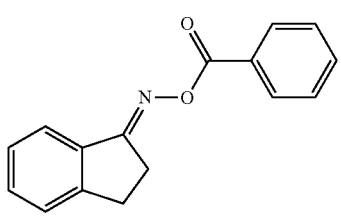
(OS-44)
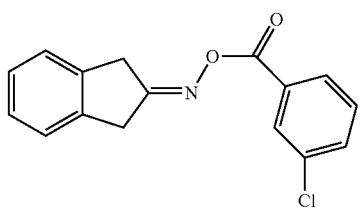
(OS-49)
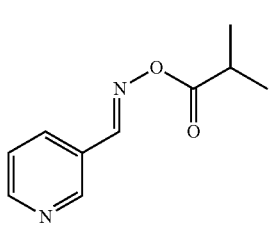
(OS-45)
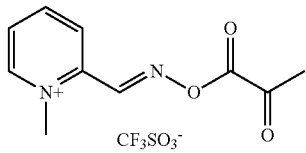
(OS-50)
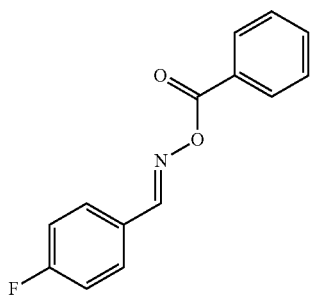
(OS-46)
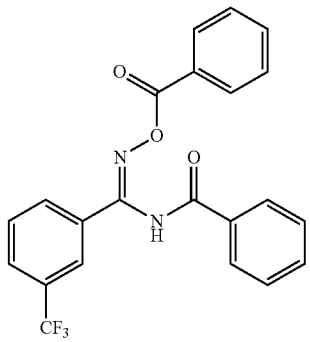
(OS-51)
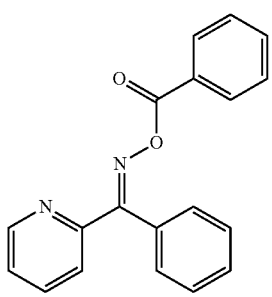
(OS-47)
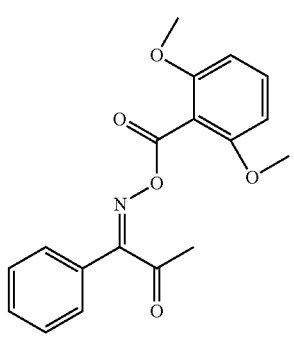
(OS-52)

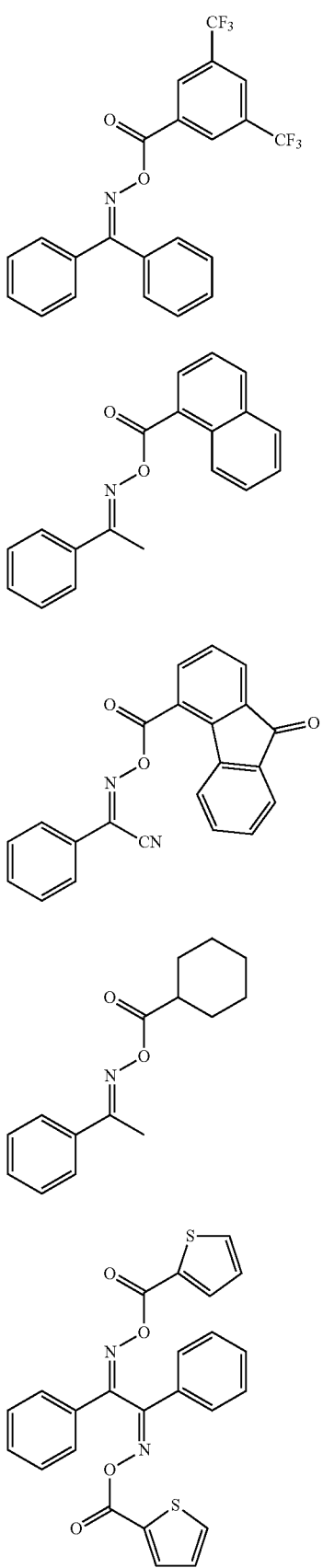
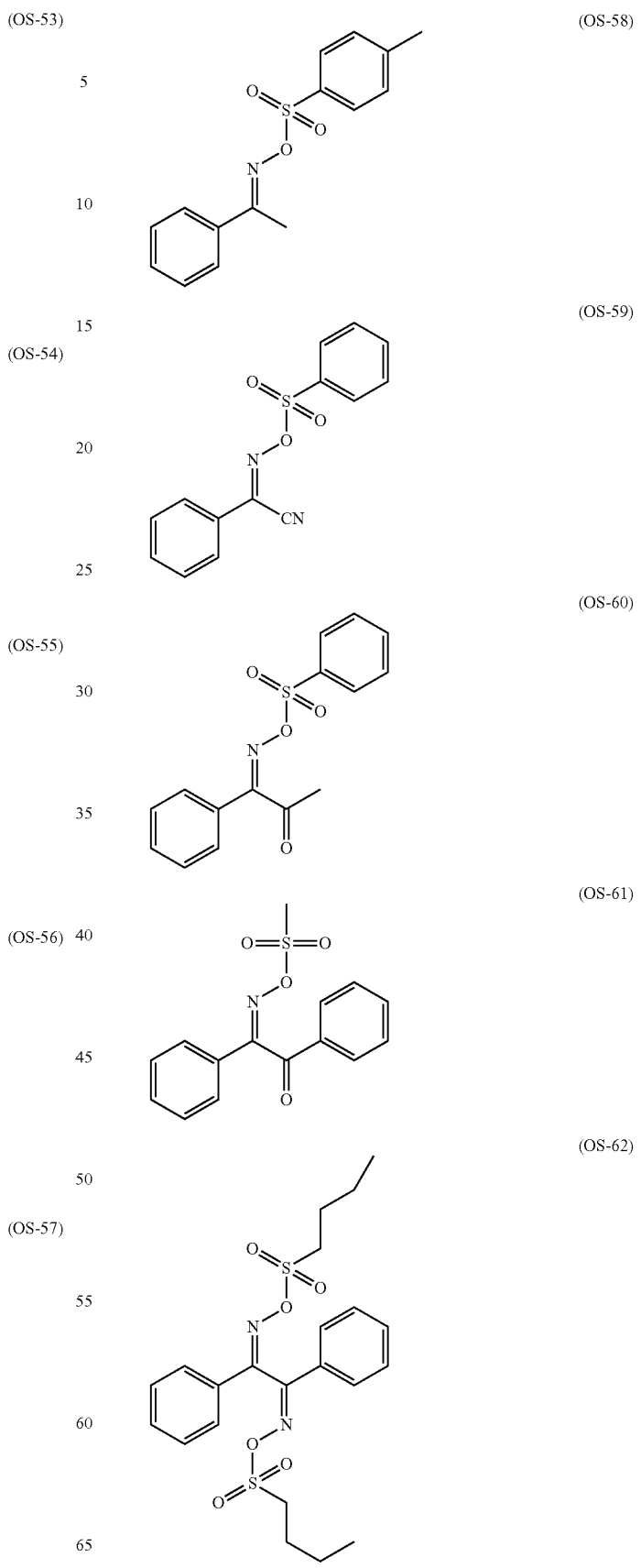

-continued
(OS-63)
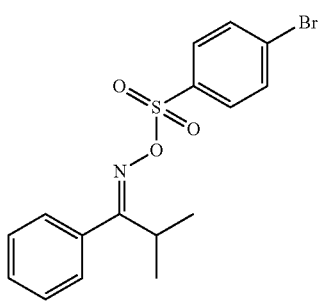
(OS-64)
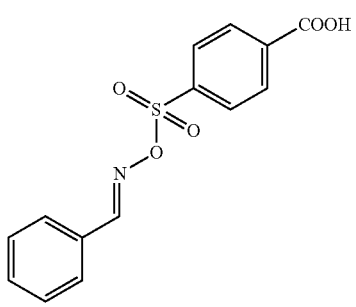
(OS-65)
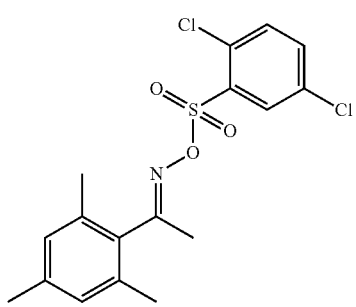
(OS-66)
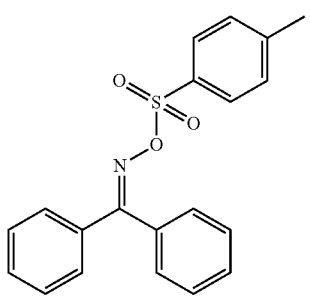
(OS-67)
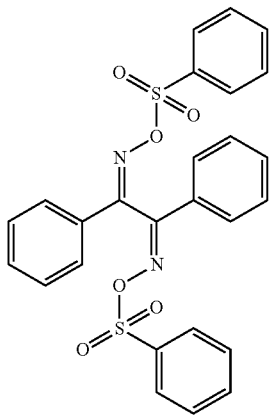
-continued
(OS-68)
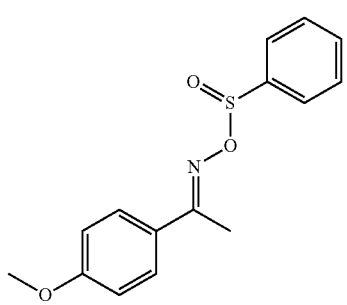
(OS-69)
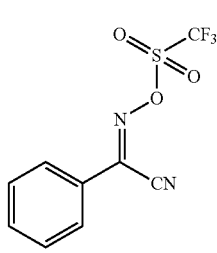
(OS-70)
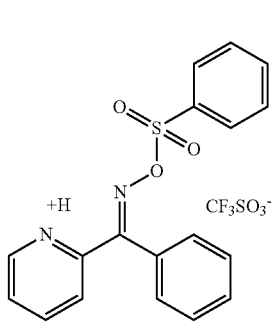
(OS-71)
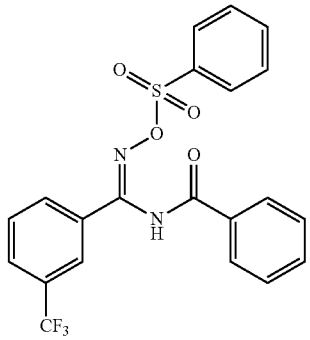
(OS-72)
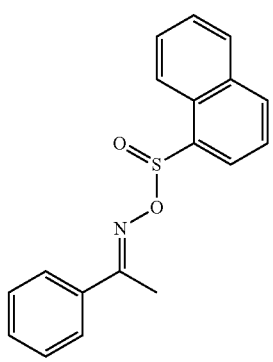

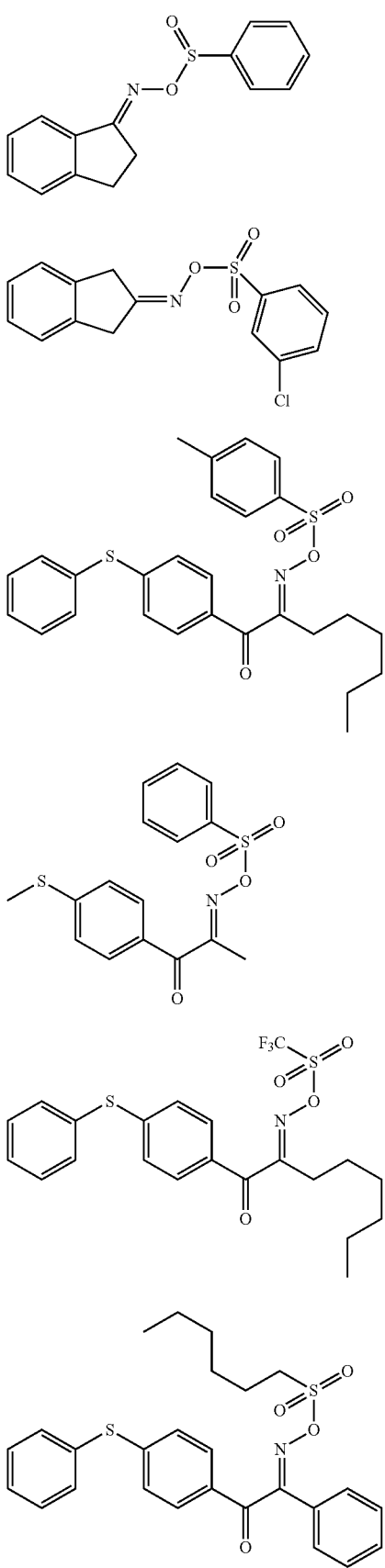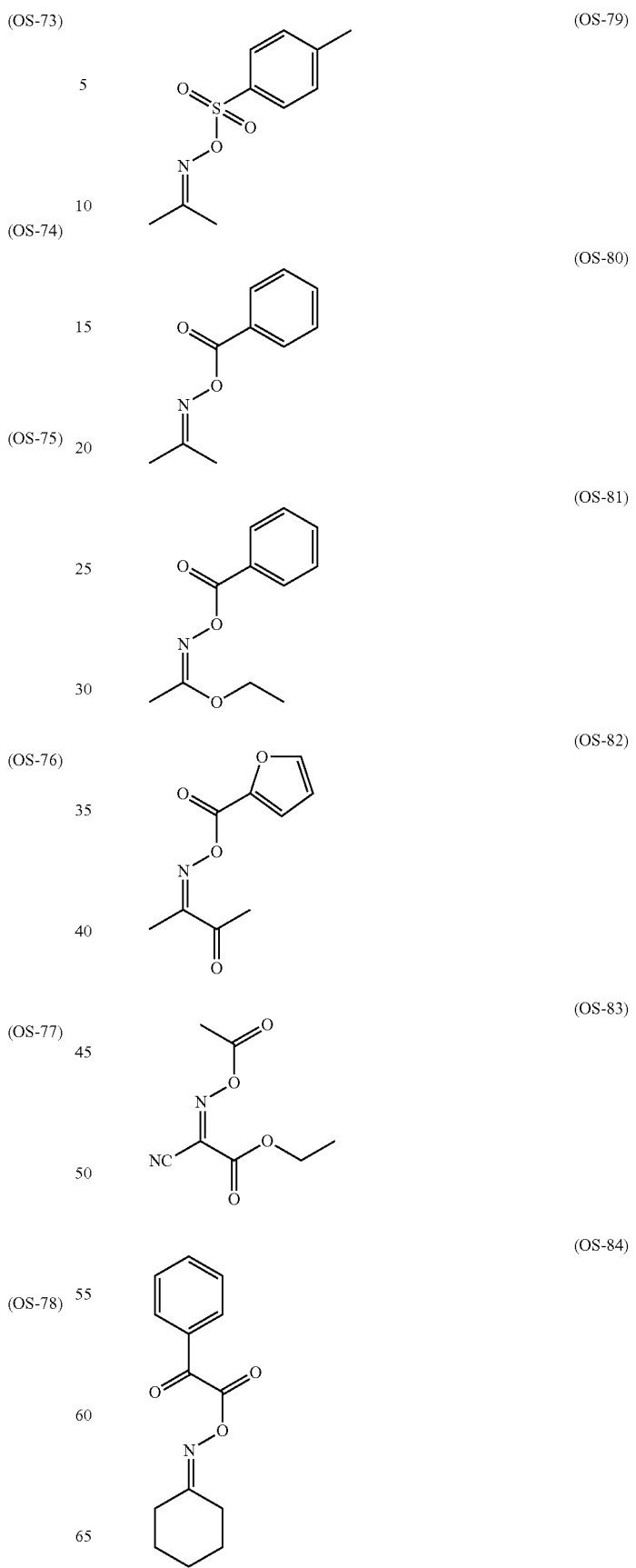

(OS-85) 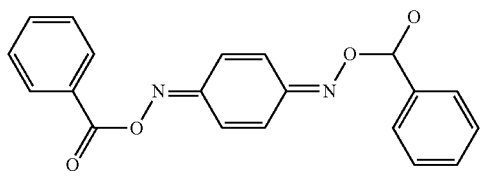
(OS-86) 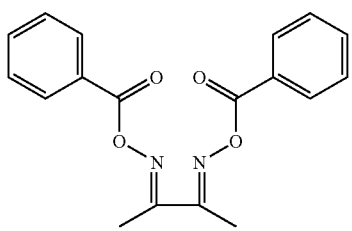
(OS-87) 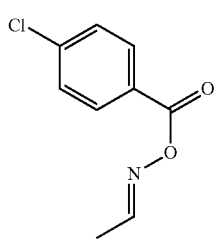
(OS-88) 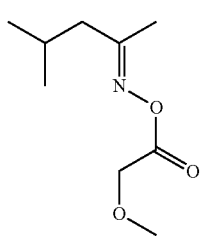
(OS-89) 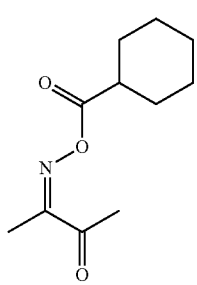
(OS-90) 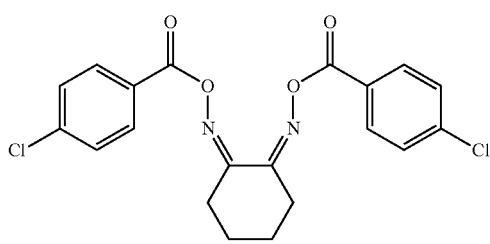
(OS-91) 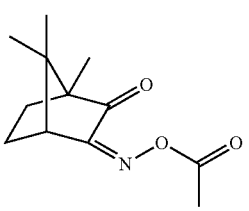
(OS-92) 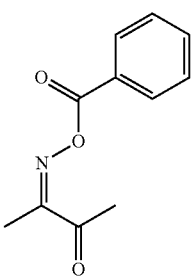
(OS-93) 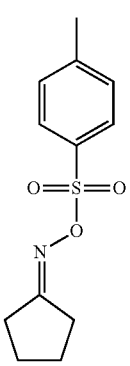
(OS-94) 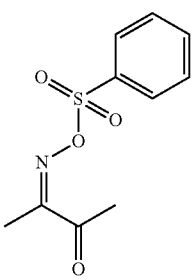
(OS-95) 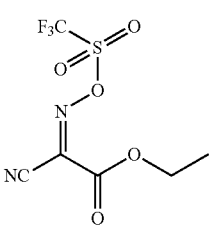

41
-continued
(OS-96)
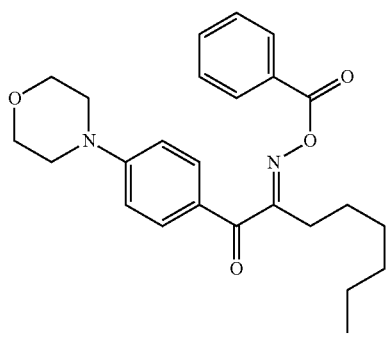
(OS-97)
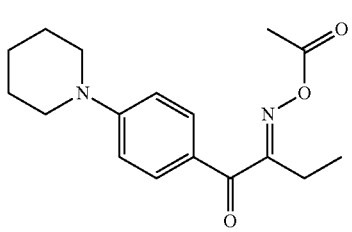
(OS-98)
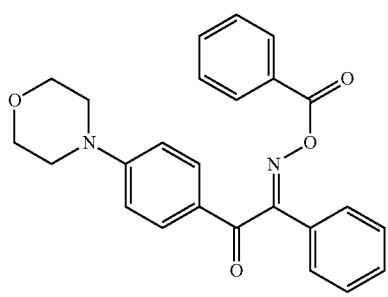
(OS-99)
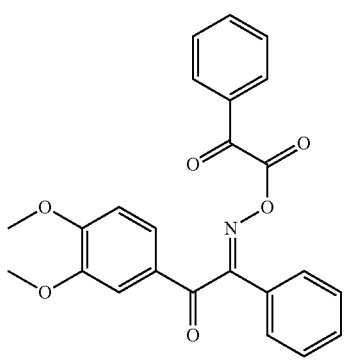
(OS-100)
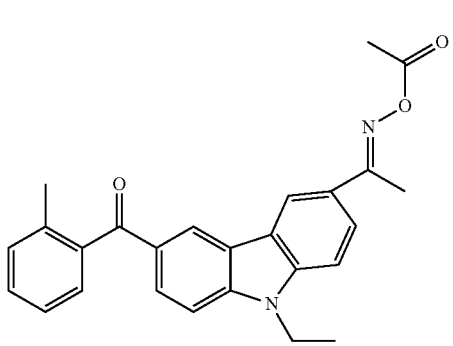
42
-continued
(OS-101)
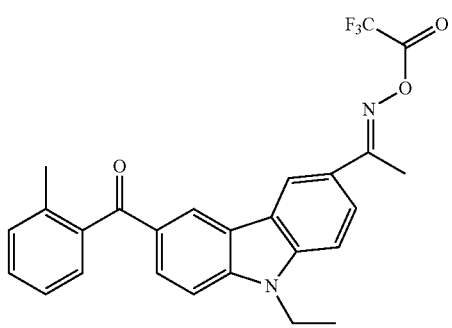
(OS-102)
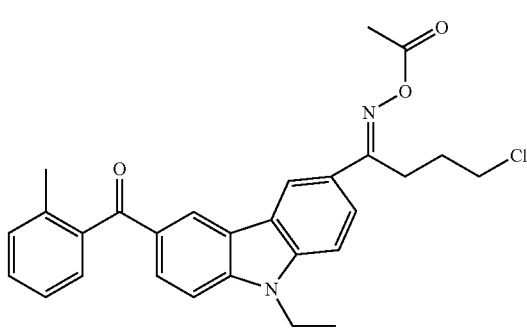
(OS-103)
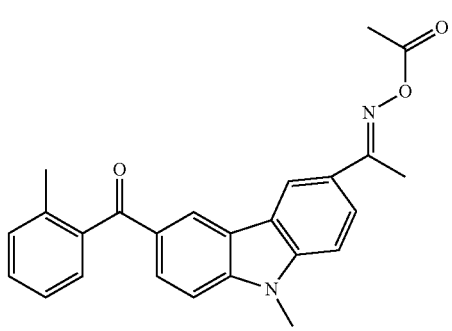
(OS-104)
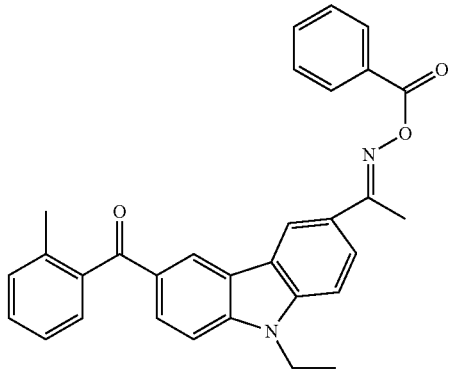

(OS-105)
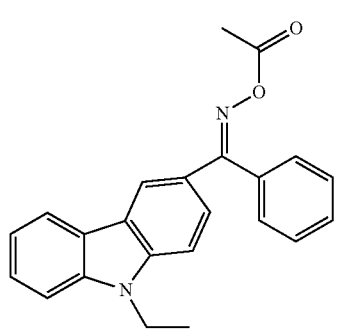

(OS-106)
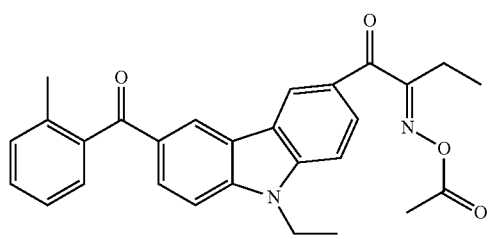

(OS-107)
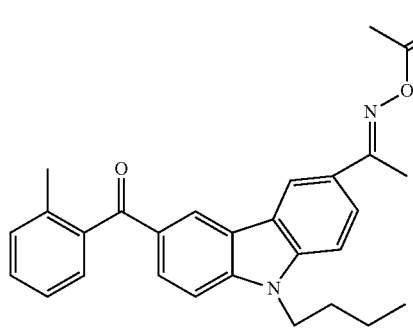

(OS-108)
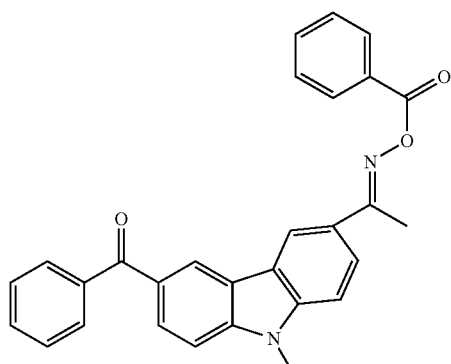

(OS-109)
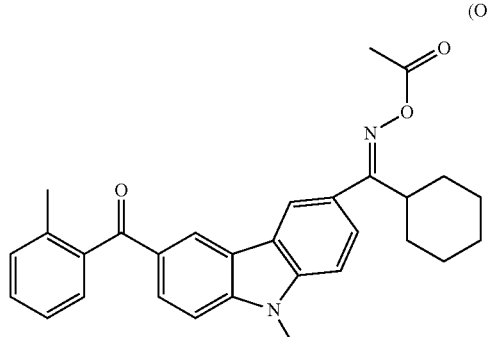

(OS-110)
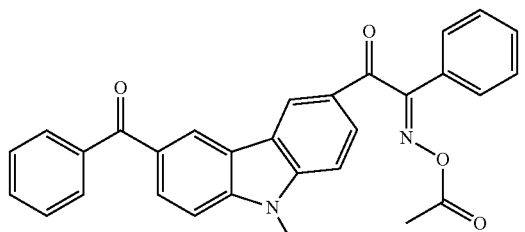

(OS-111)
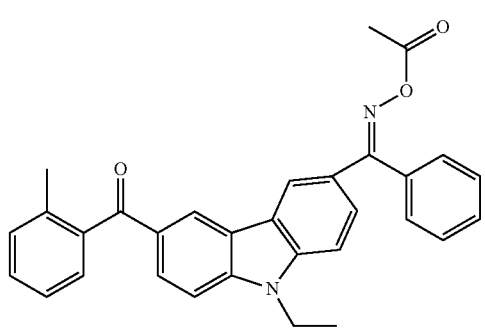

(OS-112)
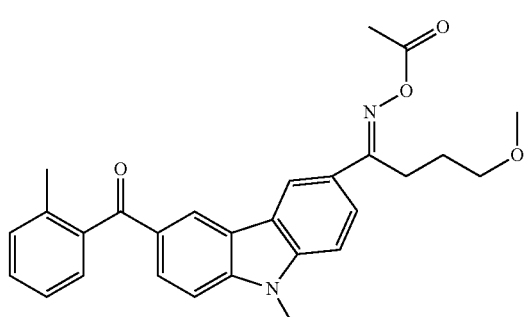

(OS-113)
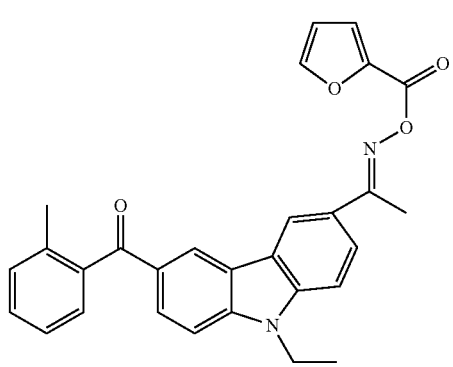

Among the specific examples shown above, the specific oxime compound preferably has a heterocyclic structure and/or a sulfide structure, and it is more preferable that the specific compound having a heterocyclic structure and/or a sulfide structure has a structure represented by Formula (2), from the viewpoints of sensitivity and stability. The specific oxime compound is most preferably a compound having a structure represented by Formula (2) having a carbazole derivative as the heterocycle.

The specific oxime compound can be obtained by synthesis or purchase of a commercial product. An example of the synthesis method is the method described in JP-A No. 2009-

042751. Further, the compound shown as specific example OS-1 in the above is available from Ciba Specialty Chemicals Inc.

The content of the (B) photopolymerization initiator contained in the curable composition of the invention is preferably from 0.1% by mass to 50% by mass, more preferably from 0.5% by mass to 30% by mass, and particularly preferably from 1% by mass to 20% by mass, relative to the total amount of solids contained in the curable composition. Within the above range, improved sensitivity and capability of forming a tough cured portion are obtained.

(C) Polymerizable Compound

The colored curable composition according to the invention includes (C) a polymerizable compound.

The (C) polymerizable compound in the invention may be a common radical-polymerizable compound, and compounds that are widely known as compounds having an ethylenic unsaturated double bond in the relevant industrial field may be used without particular limitations. Such compounds may be in the chemical form of a monomer or a prepolymer, specifically a dimer, a trimer or an oligomer, or a mixture thereof or a copolymer thereof.

Examples of monomers and copolymers thereof include unsaturated carboxylic acids (such as acrylic acid, methacrylic acid, itaconic acid, crotonic acid, isocrotonic acid, and maleic acid), esters thereof, and amides thereof. Preferable examples thereof include: an ester of an unsaturated carboxylic acid and an aliphatic polyhydric alcohol compound; an amide of an unsaturated carboxylic acid and an aliphatic polyamine compound; an addition reaction product of an unsaturated carboxylic ester or unsaturated carboxylic amide having a nucleophilic substituent (such as a hydroxyl group, an amino group, or a mercapto group), with a monofunctional or polyfunctional isocyanate or epoxy compound; and a dehydration condensation reaction product of the unsaturated carboxylic ester or unsaturated carboxylic amide with a monofunctional or polyfunctional carboxylic acid. Other preferable examples include: an addition reaction product of an unsaturated carboxylic ester or unsaturated carboxylic amide having an electrophilic substituent (such as an isocyanato group or an epoxy group), with a monofunctional or polyfunctional alcohol, amine, or thiol; and a substitution reaction product of an unsaturated carboxylic ester or unsaturated carboxylic amide having a halogen group or a leaving substituent (such as a tosyloxy group), with a monofunctional or polyfunctional alcohol, amine, or thiol. Still other examples for use include compounds each obtained by replacing an unsaturated carboxylic acid in the above examples by an unsaturated phosphonic acid, styrene, vinyl ether, or the like.

Specific examples of the ester of an aliphatic polyhydric alcohol compound and an unsaturated carboxylic acid as a monomer include:

an acrylic ester such as ethyleneglycol diacrylate, triethyleneglycol diacrylate, 1,3-butanediol diacrylate, tetramethyleneglycol diacrylate, propyleneglycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, a polyester acrylate oligomer, or an EO-modified or PO-modified form of any of these compounds;

a methacrylic ester such as tetramethyleneglycol dimethacrylate, triethyleneglycol dimethacrylate, neopentylglycol dimethacrylate, trimethylolpropane trimethacrylate, trimethylolethane trimethacrylate, ethyleneglycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, or an EP-modified or PO-modified form of any of these compounds;

an itaconic ester such as ethyleneglycol diitaconate, propyleneglycol diitaconate, 1,3-butanediol diitaconate, 1,4-butanediol diitaconate, tetramethyleneglycol diitaconate, pentaerythritol diitaconate, or sorbitol tetraitaconate;

a crotonic ester such as ethyleneglycol dicrotonate, tetramethyleneglycol dicrotonate, pentaerythritol dicrotonate, or sorbitol tetradicrotonate;

an isocrotonic ester such as ethyleneglycol diisocrotonate, pentaerythritol diisocrotonate, or sorbitol tetraisocrotonate; and a maleic ester such as ethyleneglycol dimaleate, triethyleneglycol dimaleate, pentaerythritol dimaleate, or sorbitol tetramaleate.

Examples of other esters that can be suitably used include the aliphatic alcohol esters described in JP-B No. 51-47334 and JP-A No. 57-196231, the aromatic skeleton-containing esters described in JP-A No. 59-5240, JP-A No. 59-5241 and JP-A No. 2-226149, and the amino group-containing esters described in JP-A No. 01-165613. The ester monomers described above may be used in the form of a mixture thereof.

Examples of the amide of an aliphatic polyamine compound and an unsaturated carboxylic acid as a monomer include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Examples of other preferred amide monomers include the compounds having a cyclohexylene structure described in JP-B No. 54-21726.

Addition-polymerizable urethane compounds produced by an addition reaction of isocyanate with a hydroxyl group are also preferred, examples of which include vinyl urethane compounds, which have two or more polymerizable vinyl groups within a molecule thereof and are produced by adding a hydroxyl group-containing vinyl monomer represented by Formula (E) shown below to a polyisocyanate compound having two or more isocyanato groups within a molecule thereof and described in JP-B No. 48-41708.

$$CH_2=C(R^4)COOCH_2CH(R^5)OH \qquad (E)$$

In Formula (E), $R^4$ and $R^5$ each independently represent H or $CH_3$.

Urethane acrylates such as those described in JP-A No. 51-37193, JP-B No. 2-32293 and JP-B No. 2-16765, and urethane compounds having an ethyleneoxide skeleton and described in JP-B No. 58-49860, JP-B No. 56-17654, JP-B No. 62-39417 and JP-B No. 62-39418 are also preferable. A curable composition having excellent photoresponsive speed can also be obtained by using an addition-polymerizable compound having an amino or sulfide structure in a molecule thereof, which are disclosed in JP-A No. 63-277653, JP-A No. 63-260909 and JP-A No. 1-105238.

Other examples include polyester acrylates such as those described in JP-A No. 48-64183, JP-B No. 49-43191, and JP-B No. 52-30490, and polyfunctional acrylates or methacrylates such as an epoxy acrylate obtained by reaction of an epoxy resin and (meth)acrylic acid. Further examples include the particular unsaturated compounds described in JP-B No. 46-43946, JP-B No. 1-40337, and JP-B No. 1-40336, and the vinylphosphonic acid compounds described in JP-A No. 2-25493. Further, the structure containing a perfluoroalkyl group and described in JP-A No. 61-22048 is suitably used in some cases. Photocurable monomers and oligomers described in *Nihon Secchaku Kyoukaishi* (Journal of the Adhesion Society of Japan), Vol. 20, No. 7, pp. 300 to 308 (1984) are also usable.

In the invention, the polymerizable compound preferably contains two or more ethylenic unsaturated bonds, and more preferably contains three or more ethylenic unsaturated double bonds, from the viewpoint of curing sensitivity. In particular, the polymerizable compound preferably contains two or more (meth)acrylic ester structures, more preferably three or more (meth)acrylic ester structures, and most preferably four or more (meth)acrylic ester structures. From the viewpoints of curing sensitivity and developability of portions that have not been exposed to light, it is most preferable that the polymerizable compound contains an EO-modified form. It is preferable from the viewpoint of curing sensitivity and the strength of light-exposed portions, that the polymerizable compound contains a urethane bond.

From the above viewpoints, preferable examples of the polymerizable compound include bisphenol A diacrylate, an EO-modified form of bisphenol A diacrylate, trimethylolpropane triacrylate, trimethylolpropane tri(acryloyloxypropyl) ether, trimethylolethane triacrylate, tetraethyleneglycol diacrylate, pentaerythrytol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, an EO-modified form of pentaerythritol tetraacrylate, and an EO-modified form of dipentaerythritol hexaacrylate. Examples of commercially available products thereof include: urethane oligomers UAS-10 and UAB-140 (both of which are tradenames, manufactured by Sanyo-Kokusaku pulp Co., Ltd.); DPHA-40H (tradename, manufactured by Nippon Kayaku Co., Ltd.); and UA-306H, UA-306T, UA-306I, AH-600, T-600 and AI-600 (all of which are tradenames, manufactured by Kyoei Co., Ltd.).

Of these, more preferable examples of the polymerizable compound are an EO-modified form of bisphenol A diacrylate, pentaerythritol triacrylate, pentaerythritol tetraacrylate, dipentaerythritol pentaacrylate, dipentaerythritol hexaacrylate, tri(acryloyloxyethyl)isocyanurate, an EO-modified form of pentaerythritol tetraacrylate, and an EO-modified form of dipentaerythritol hexaacrylate, and more preferable examples of commercially available products are DPHA-40H (manufactured by Nippon Kayaku Co., Ltd.), and UA-306H, UA-306T, UA-306I, AH-600, T-600 and AI-600 (manufactured by Kyoei Co., Ltd.).

Ethylenic unsaturated compounds having an acid group are also preferable. Examples of commercially-available products thereof include TO-756 (a trifunctional acrylate containing a carboxyl group) and TO-1382 (a pentafunctional acrylate containing a carboxyl group), both of which are tradenames and manufactured by TOAGOSEI CO., LTD.

The (C) polymerizable compound may be used singly, or in combination of two or more thereof.

The content of the (C) polymerizable compound in the colored curable composition of the invention is preferably from 4% by mass to 80% by mass, and more preferably from 7% by mass to 50% by mass, in terms of solids amount ratio.

In particular, when the film thickness is 0.8 µm or less, the addition amount is preferably from 7% by mass to 40% by mass, and particularly effectively from 6% by mass to 25% by mass, relative to the total solids content.

(D) Pigment

The colored curable composition of the invention further includes a pigment as a coloring agent. Since the colored curable composition includes a pigment, formation of a colored cured body (cured coating film) can be achieved, and the colored curable composition can be applied, for example, as an image forming material or to formation of a colored pattern of a color filter.

One of, or a mixture of two or more of, various known pigments may be used as a coloring agent contained in the curable composition of the invention. From the viewpoint of pigment structure, use thereof as a red pigment or a yellow pigment is effective.

In regard to pigments usable in the curable composition in the invention, various known inorganic or organic pigments may be used. Use of a pigment having a particle diameter as small as possible is preferable regardless of whether the pigment is an inorganic pigment or an organic pigment, considering that the pigment preferably has high transmittance. Further considering handling properties, the average particle diameter of the pigment is preferably from 0.01 µm to 0.1 µm, and more preferably from 0.01 µm to 0.05 µm. Examples of the inorganic pigment include a metal compound such as a metal oxide or a metal complex salt, and specific examples thereof include an oxide of a metal such as iron, cobalt, aluminum, cadmium, lead, copper, titanium, magnesium, chromium, zinc, or antimony, and a complex oxide of any of the above metals.

Examples of the organic pigment include:

C.I. Pigment Yellow 11, 24, 31, 53, 83, 93, 99, 108, 109, 110, 138, 139, 147, 150, 151, 154, 155, 167, 180, 185, 199;

C.I. Pigment Orange 36, 38, 43, 71;

C.I. Pigment Red 81, 105, 122, 149, 150, 155, 166, 171, 175, 176, 177, 209, 220, 224, 242, 254, 255, 264, 270;

C.I. Pigment Violet 19, 23, 32, 39;

C.I. Pigment Blue 1, 2, 15, 15:1, 15:3, 15:6, 16, 22, 60, 66;

C.I. Pigment Green 7, 36, 37, 58;

C.I. Pigment Brown 25, 28;

C.I. Pigment Black 1, 7; and carbon black.

In the invention, a pigment having a basic nitrogen atom in the structural formula thereof may preferably be used. A pigment having a basic nitrogen atom exhibits excellent dispersibility in the composition of the invention. Although the reason thereof has not been fully clarified, it is presumed that high affinity of a pigment of this kind to those having a structural unit containing an aromatic ring or a nitrogen atom among other polymerizable components and the (A) specific polymer contained in the colored curable composition exerts influence.

Examples of pigments that can favorably be used in the invention of the present application include the following. However, the invention is not limited thereto.

C.I. Pigment Yellow 11, 24, 108, 109, 110, 138, 139, 150, 151, 154, 167, 180, 185;

C.I. Pigment Orange 36, 71;

C.I. Pigment Green 7, 36, 37, 58;

C.I. Pigment Red 122, 150, 166, 171, 175, 177, 209, 224, 242, 254, 255, 264;

C.I. Pigment Violet 19, 23, 32;

C.I. Pigment Blue 15:1, 15:3, 15:6, 16, 22, 60, 66; and

C.I. Pigment Black 1.

The organic pigment may be used singly, or in various combinations thereof in order to increase color purity. Specific examples of the combinations are described below.

For example, an anthraquinone pigment, a perylene pigment, or a diketopyrrolopyrrole pigment may be used singly; or a mixture of at least one of these red pigments with a disazo yellow pigment, an isoindoline yellow pigment, a quinophthalone yellow pigment, or a perylene red pigment may be used, as a red pigment. For example, examples of anthraquinone pigments include C.I. Pigment Red 177, examples of perylene pigments include C.I. Pigment Red 155 and C.I. Pigment Red 224, and examples of diketopyrrolopyrrole pigments include C.I. Pigment Red 254; in consideration of color reproducibility, a mixture of at least one of these pigments with C.I. Pigment Yellow 139 is preferable.

The mass ratio of red pigments to yellow pigments (red pigments/yellow pigments) is preferably in the range of from 100/5 to 100/50. When the mass ratio is within the above range, light transmittance at a wavelength region of from 400 nm to 500 nm is sufficiently suppressed. When the mass ratio is within the above range, problems such as inability to increase color purity or increased deviation from the NTSC (National Television System Committee) target hue due to the main wavelength excessively shifting towards the shorter wavelength side do not arise. In particular, the mass ratio is most preferably in the range of from 100:10 to 100:30. In a case in which red pigments are combined with each other, the mass ratio thereof may be adjusted suitably according to the chromaticity.

As a green pigment, a halogenated phthalocyanine pigment may be used singly, or a mixture of a halogenated phthalocyanine pigment with a disazo yellow pigment, a quinophthalone yellow pigment, an azomethine yellow pigment, or an isoindoline yellow pigment, may be used. Preferable examples of the mixture include a mixture of C.I. Pigment Green 7, C.I. Pigment Green 36, C.I. Pigment Green 37, or C.I. Pigment Green 58 with C.I. Pigment Yellow 83, C.I. Pigment Yellow 138, C.I. Pigment Yellow 139, C.I. Pigment Yellow 150, C.I. Pigment Yellow 180, or C.I. Pigment Yellow 185. The mass ratio of green pigments to yellow pigments (green pigments/yellow pigments) is preferably in the range of from 100/5 to 100/150, and particularly preferably in the range of from 100/30 to 100/120.

As a blue pigment, a phthalocyanine pigment may be used singly, or a mixture of a phthalocyanine pigment and a dioxazine purple pigment may be used. For example, a mixture of C.I. Pigment Blue 15:6 and C.I. Pigment Violet 23 is preferable. The mass ratio of blue pigments to purple pigments (blue pigments/purple pigments) is preferably in the range of from 100/0 to 100/30, and more preferably 100/(10 or less).

As a pigment for a black matrix, carbon black, titanium black, iron oxide, or titanium oxide may be used singly, or a mixture of two or more kinds thereof may be used. A combination of carbon black and titanium black is preferable. The mass ratio of carbon black to titanium black (carbon black/titanium black) is preferably in the range of from 100/0 to 100/60.

In a case in which the colored curable composition of the invention is used for a color filter, the primary particle diameter of the pigment is preferably from 10 to 100 nm, more preferably from 10 to 70 nm, and further preferably from 10 to 50 nm, and most preferably from 10 to 40 nm, from the viewpoints of color unevenness and contrast.

In a case in which the colored curable composition of the invention is used for a color filter, use of a dye that uniformly dissolves in the composition is also preferable from the viewpoints of color unevenness and contrast.

(E) Dispersant Containing Phosphoric Acid Group

The colored curable composition of the invention further includes at least one (E) dispersant containing a phosphoric acid group (hereinafter also referred to as "(E) specific dispersant").

In a preferable embodiment, the (A) specific polymer is added to a pigment dispersion liquid containing a pigment dispersed by using the dispersant containing a phosphoric acid group, and the resultant is used.

A compound represented by the following Formula (II) is preferable as the (E) dispersant containing a phosphoric acid group.

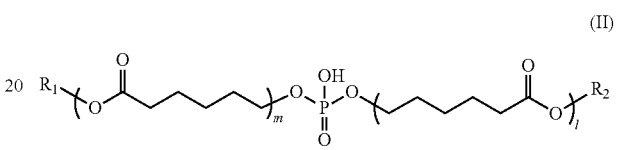

(II)

In Formula (II), $R_1$ and $R_2$ each independently represent a hydrogen atom or a hydrocarbon group having from 1 to 20 carbon atoms, and m and/each independently represent an integer of from 1 to 200.

Here, $R_1$ and $R_2$ each independently represent preferably a hydrocarbon group having from 1 to 20 carbon atoms, and more preferably a hydrocarbon group having from 6 to 20 carbon atoms, from the viewpoints of coating film uniformity and planarity.

From the viewpoint of coating film uniformity and planarity, m and/each independently represent preferably an integer of from 2 to 20, and more preferably an integer of from 6 to 20.

The content of the (E) specific dispersant in the pigment dispersion liquid is preferably from 0 to 100 parts by mass, and more preferably from 3 to 70 parts by mass, relative to 100 parts by mass of the (D) pigment.

Pigment Derivative

The colored curable composition of the invention may include a pigment derivative, in accordance with necessity.

In the case of using a pigment derivative, a pigment derivative to which a moiety having affinity for a dispersant or a polar group has been introduced is adsorbed on the surface of the pigment, and may serve as an adsorption site for the dispersant; as a result, the pigment can be dispersed as fine particles in the colored curable composition, and reaggregation thereof is prevented. Therefore, the use of a pigment derivative is effective for forming a color filter that is excellent in dispersion stability.

A known pigment derivative having an organic pigment as a parent skeleton can be appropriately used as the pigment derivative. Specific examples of the organic pigment include quinacridone pigments, phthalocyanine pigments, azo pigments, quinophthalone pigments, isoindoline pigments, isoindolinone pigments, quinoline pigments, diketopyrrolopyrrole pigments, and benzimidazolone pigments, and further include pale-yellow aromatic polycyclic compounds, such as naphthalene compounds, anthraquinone compounds, triazine compounds, and quinoline compounds, that are not generally called "pigments". Examples of pigment derivatives that can be used further include those described in JP-A No. 11-49974, JP-A No. 11-189732, JP-A No. 10-245501, JP-A No. 2006-265528, JP-A No. 8-295810, JP-A No.

11-199796, JP-A No. 2005-234478, JP-A No. 2003-240938, JP-A No. 2001-356210, and the like.

The content of pigment derivative in the pigment dispersion liquid in the invention is preferably from 0 to 30 parts by mass, and more preferably from 3 to 20 parts by mass, relative to 100 parts by mass of pigment. When the content is within the above range, dispersing can be satisfactorily conducted and dispersion stability after dispersing is improved, while viscosity is maintained low.

Preparation of Pigment Dispersion Liquid

In a case in which a pigment is used in the colored curable composition, it is preferable, from the viewpoints of pigment dispersibility and dispersion stability, to prepare a pigment dispersion liquid in advance, and add the pigment in the form of the dispersion liquid.

The pigment dispersion liquid can be prepared by mixing a pigment, a dispersant, and, optionally, a pigment derivative in advance, dispersing the mixture using a homogenizer or the like, and finely-dispersing the resultant using a bead disperser in which zirconia beads or the like are used (for example, DISPERMAT (tradename) manufactured by GETZMANN Gmbh). The dispersing time is preferably from about 3 hours to about 6 hours. The specific pigment derivative can be added at any stage in the preparation of the pigment dispersion liquid. It is preferable to add the specific pigment derivative at a fining process and/or at the time of finely-dispersing.

The colored curable composition of the invention can be obtained by using the thus-prepared pigment dispersion liquid containing the (D) pigment and the (E) specific dispersant, and adding the above-described (A) specific polymer, (B) photopolymerization initiator, (C) polymerizable compound, and other components. It is also permissible to use the (A) specific polymer during the preparation of the pigment dispersion liquid.

The amount of the (D) pigment contained in the colored curable composition of the invention is preferably in the range of from 5% by mass to 90% by mass, and more preferably in the range of from 25% by mass to 85% by mass.

In addition to the components (A) to (D), various additives may be used in the colored curable composition of the invention in accordance with the purpose, as long as the effects of the invention are not impaired.

Optional components that may be contained in the colored curable composition of the invention are described below.

Binder Polymer

In addition to the (A) specific polymer, another binder polymer may be used in the colored curable composition of the invention for the purpose of improving film properties or controlling developability, in accordance with the necessity. Another binder polymer as an optional component in the invention is a polymer that does not contain a structural unit represented by Formula (I) described above.

The binder to be used is preferably a linear organic polymer that does not contain a structural unit represented by Formula (I). The linear organic polymer may be freely selected from known ones. In order to enable development with water or a weakly alkaline aqueous solution, it is preferable to select a linear organic polymer that is soluble or swellable in water or a weakly alkaline aqueous solution. The linear organic polymer may be selected and used in consideration of not only its function as a film-forming agent, but also its function as an agent that allows development with water, a weakly alkaline aqueous solution or an organic solvent. For example, use of a water-soluble organic polymer enables development with water. Examples of the linear organic polymer include radical polymerization products having a carboxylic acid group at a side chain thereof, such as polymers described in JP-A No. 59-44615, JP-B No. 54-34327, JP-B No. 58-12577, JP-B No. 54-25957, JP-A No. 54-92723, JP-A No. 59-53836, and JP-A No. 59-71048. Specific examples thereof include a resin obtained by homopolymerization or copolymerization of a carboxyl group-containing monomer, a resin obtained by hydrolysis, half-esterification or half-amidation of acid anhydride units of a homopolymer or copolymer of an acid anhydride-containing monomer, and an epoxy acrylate obtained by modifying an epoxy resin with an unsaturated monocarboxylic acid and an acid anhydride. Examples of the carboxyl group-containing monomer include acrylic acid, methacrylic acid, itaconic acid, crotonic acid, maleic acid, fumaric acid, and 4-carboxylstyrene. Examples of the acid anhydride-containing monomer include maleic anhydride.

Further examples include an acidic cellulose derivative having a carboxylic acid group at a side chain thereof, and a product obtained by adding a cyclic acid anhydride to a hydroxyl group-containing polymer.

In a case in which a copolymer is used as an alkali-soluble resin, one or more monomers other than the above-described monomers may be used as compounds to be copolymerized. Examples of other monomers include the following compounds (a) to (l):

(a) acrylic esters having an aliphatic hydroxyl group and methacrylic esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate and 4-hydroxybutyl methacrylate;

(b) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate;

(c) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate;

(d) acrylamides or methacrylamides, such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinyl acrylamide, vinyl methacrylamide, N,N-diallylacrylamide, N,N-diallylmethacrylamide, allylacrylamide, and allylmethacrylamide;

(e) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether;

(f) vinyl esters such as vinyl acetate, vinyl chloroacetate, vinyl butyrate, and vinyl benzoate;

(g) styrenic compounds such as styrene, α-methylstyrene, methylstyrene, chloromethylstyrene, and p-acetoxystyrene;

(h) vinyl ketones such as methyl vinyl ketone, ethyl vinyl ketone, propyl vinyl ketone, and phenyl vinyl ketone;

(i) olefins such as ethylene, propylene, isobutylene, butadiene, and isoprene;

(j) N-vinylpyrrolidone, acrylonitrile, methacrylonitrile, and the like;

(k) unsaturated imides such as maleimide, N-acryloylacrylamide, N-acetylmethacrylamide, N-propionylmethacrylamide, and N-(p-chlorobenzoyl)methacrylamide; and (l) methacrylic monomers in which a hetero atom is bonded to the α-position, such as compounds described in JP-A No 2002-309057 and JP-A No. 2002-311569.

Of these compounds, (meth)acrylic resins having an allyl group or vinyl ester group and a carboxyl group at side chains thereof, alkali-soluble resins having a double bond at a side chain thereof and described JP-A No. 2000-187322 and JP-A No. 2002-62698, and alkali-soluble resins having an amido group at a side chain thereof and described in JP-A No. 2001-242612 are preferable in view of their excellent balance between film forming properties, sensitivity and developability.

Acid group-containing urethane binder polymers, such as those described in JP-B No. 7-12004, JP-B No. 7-120041, JP-B No. 7-120042, and JP-B No. 8-12424, JP-A No. 63-287944, JP-A No. 63-287947, and JP-A No. 1-271741, and urethane binder polymers having an acid group and a double bond at side chains thereof and described in JP-A No. 2002-107918 are advantageous in terms of printing durability and compatibility with low exposure amount due to their excellent strength.

Acetal-modified polyvinyl alcohol binder polymers having an acid group, such as those described in European Patent No. 993966, European Patent No. 1204000, and JP-A No. 2001-318463, are preferable in that they provide an excellent balance between film strength and developability.

Examples of water-soluble linear organic polymers further include polyvinyl pyrrolidone and polyethylene oxide. An alcohol-soluble nylon or a polyether of 2,2-bis-(4-hydroxyphenyl)-propane and epichlorohydrin is also useful in terms of increasing the strength of a cured film.

The weight average molecular weight of the binder polymer optionally used in the invention is preferably 3,000 or more, and more preferably from 5,000 to 300,000, and the number average molecular weight thereof is preferably 1,000 or more, and more preferably from 2,000 to 250,000. The polydispersity of the binder polymer (weight average molecular weight/number average molecular weight) is preferably 1 or higher, and more preferably in the range of from 1.1 to 10.

The binder polymer may take any form of random polymer, block polymer, graft polymer, or the like.

The binder polymer optionally used in the invention may be synthesized by a known method. Examples of a solvent used in the synthesis include tetrahydrofuran, ethylene dichloride, cyclohexanone, methyl ethyl ketone, acetone, methanol, ethanol, ethyleneglycol monomethyl ether, ethyleneglycol monoethyl ether, 2-methoxyethyl acetate, diethyleneglycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, and water. One of these solvents may be used singly, or two or more thereof may be used in mixture.

The radical polymerization initiator used in the synthesis of the binder polymer optionally used in the invention may be a known compound such as an azo initiator or a peroxide initiator.

In a case in which the colored curable composition of the invention is used for image formation involving alkali development process in order to form a colored pattern of a color filter for a liquid crystal or solid-state imaging device, it is preferable to use a binder polymer having an acid group and/or a hydrophilic group as a binder polymer.

Preferable examples of an acid group that the binder polymer used for such a purpose possesses include a carboxyl group, a sulfonamido group, a sulfonic acid group, a phosphonic acid group, and a phenol group. The acid value of the binder polymer is preferably from 0.1 mmol/g to 10 mmol/g, more preferably from 0.2 mmol/g to 5 mmol/g, and most preferably from 0.3 mmol/g to 3 mmol/g, from the viewpoints of developability and sensitivity.

The binder polymer may be added together with ingredients of the pigment dispersion liquid at the time of dispersing the pigment. Alternatively, it is permissible to add the binder polymer when the colored curable composition is prepared using a pigment dispersion liquid that has already been subjected to dispersion.

The amount of the binder polymer to be added is preferably from 0% by mass to 50% by mass, and more preferably from 2% by mass to 30% by mass, relative to the total solids content of the colored curable composition.

Sensitizer

The colored curable composition of the invention may include a sensitizer for the purpose of improving radical generation efficiency of a radical initiator or shifting the photosensitive wavelength towards a longer wavelength side. The sensitizer optionally used in the invention is preferably a sensitizer that sensitizes the photopolymerization initiator by an electron transfer mechanism or an energy transfer mechanism.

Examples of sensitizers that can be used in the invention include those belonging to the following classes of compound and having an absorption wavelength in the wavelength region of from 300 nm to 450 nm.

Preferable examples of sensitizers include those belonging to the following classes of compound and having an absorption wavelength in the region of from 330 nm to 450 nm.

Specifically, examples include polynuclear aromatic compounds (such as phenanthrene, anthracene, pyrene, perylene, triphenylene, and 9,10-dialkoxyanthracene), xanthenes (such as fluorescein, eosin, erythrosine, rhodamine B, and rose bengal), thioxanthones (such as isopropylthioxanthone, diethylthioxanthone, and chlorothioxanthone), cyanines (such as thiacarbocyanine and oxacarbocyanine), merocyanines (such as merocyanine and carbomerocyanine), phthalocyanines, thiazines (such as thionine, methylene blue, and toluidine blue), acridines (such as acridine orange, chloroflavine, and acriflavine), anthraquinones (such as anthraquinone), squaryliums (such as squarylium), acridine orange, coumarins (such as 7-diethylamino-4-methylcoumarin), ketocoumarin, phenothiazines, phenazines, styrylbenzenes, azo compounds, diphenylmethane, triphenylmethane, distyrylbenzenes, carbazoles, porphyrin, spiro compounds, quinacridone, indigo, styryl, pyrylium compounds, pyromethene compounds, pyrazolotriazole compounds, benzothiazole compounds, barbituric acid derivatives, thiobarbituric acid derivatives, aromatic ketone compounds such as acetophenone, benzophenone, thioxanthone, and Michler's ketone, heterocyclic compounds such as N-aryloxazolidinone, and compounds described in, for example, European Patent No. 568,993, U.S. Pat. No. 4,508, 811, U.S. Pat. No. 5,227,227, JP-A No. 2001-125255, and JP-A No. 11-271969.

The sensitizer may be used singly, or in combination of two or more thereof.

The content of sensitizer in the colored curable composition of the invention is preferably from 0.1% by mass to 20% by mass, and more preferably from 0.5% by mass to 15% by mass, in terms of solid amount ratio, from the viewpoints of light absorption efficiency at a deep portion of the coating film and decomposition efficiency of the polymerization initiator.

Cosensitizer

The colored curable composition of the invention preferably includes a cosensitizer. In the invention, a cosensitizer exerts effects such as further improving the sensitivity of the sensitizing dye or the initiator to an actinic radiation and/or suppressing inhibition of polymerization of the polymerizable compound caused by oxygen.

Examples of the cosensitizer include amines such as compounds described in M. R. Sander et al., *Journal of Polymer Society*, vol. 10, p. 3173 (1972), JP-B No. 44-20189, JP-A No. 51-82102, JP-A No. 52-134692, JP-A No. 59-138205, JP-A No. 60-84305, JP-A No. 62-18537, JP-A No. 64-33104, and Research Disclosure No. 33825. Specific examples thereof include triethanolamine, ethyl p-dimethylaminobenzoate, p-formyldimethylaniline, and p-methylthiodimethylaniline.

Other examples of the cosensitizer include thiols and sulfides, such as thiol compounds described in JP-A No. 53-702, JP-B No. 55-500806, and JP-A No. 5-142772, and disulfide compounds described in JP-A No. 56-75643. Specific examples thereof include 2-mercaptobenzothiazole, 2-mercaptobenzoxazol, 2-mercaptobenzimidazole, 2-mercapto-4(3H)-quinazoline, and β-mercaptonaphthalene.

Still other examples of the cosensitizer include amino acid compounds (such as N-phenylglycine), organometal compounds (such as tributyltin acetate) described in JP-B No. 48-42965, hydrogen donors described in JP-B No. 55-34414, and sulfur compounds (such as trithiane) described in JP-A No. 6-308727.

The content of the cosensitizer is preferably in the range of from 0.1% by mass to 30% by mass, more preferably in the range of from 1% by mass to 25% by mass, and still more preferably in the range of from 0.5% by mass to 20% by mass, relative to the mass of the total solids of the colored curable composition, from the viewpoint of an improved curing speed achieved by the balance between polymerization growth speed and chain transfer.

Polymerization Inhibitor

In the invention, it is preferable to add a small amount of thermal polymerization inhibitor, in order to prevent unnecessary thermal polymerization of a compound having a polymerizable ethylenic unsaturated double bond during production or storage of the colored curable composition.

Examples of thermal polymerization inhibitors that can be used in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerous salt.

The amount of thermal polymerization inhibitor to be added is preferably from about 0.01% by mass to about 5% by mass relative to the mass of the entire composition. If necessary, a higher fatty acid derivative, such as behenic acid or behenamide, or the like may be added, and allowed to localize on the surface of the photosensitive layer during a process of drying after coating, in order to prevent polymerization inhibition caused by oxygen. The amount of higher fatty acid derivative to be added is preferably from about 0.5% by mass to about 10% by mass, relative to the entire composition.

Thermal Polymerization Component

It is effective that the pigment dispersion composition of the invention includes a thermal polymerization component. If necessary, an epoxy compound may be added in order to increase the strength of a coating film. Examples of the epoxy compound include compounds having two or more epoxy rings in a molecule thereof, which are, for example, bisphenol A compounds, cresol novolac compounds, biphenyl compounds, or alicyclic epoxy compounds. Examples of bisphenol A compounds include: EPOTOHTO YD-115, YD-118T, YD-127, YD-128, YD-134, YD-8125, YD-7011R, ZX-1059, YDF-8170 and YDF-170 (all of which are tradenames, manufactured by Tohto Kasei Co., Ltd.); DENACOL EX-1101, EX-1102 and EX-1103 (all of which are tradenames, manufactured by Nagase Chemtex Corporation); PLACCEL GL-61, GL-62, G101 and G102 (all of which are tradenames, manufactured by Daicel Chemical Industries Ltd.); and bisphenol F and bisphenol S compounds that are similar to the above bisphenol A-type compounds. Epoxy acrylates such as EBECRYL 3700, 3701 and 600 (all of which are tradenames, manufactured by Daicel UCB Company Ltd.) are also usable. Examples of cresol novolac compounds include EPOTOHTO YDPN-638, YDPN-701, YDPN-702, YDPN-703 and YDPN-704 (all of which are tradenames, manufactured by Tohto Kasei Co., Ltd.), and DENACOL EM-125 (tradename, manufactured by Nagase Chemtex Corporation). Examples of biphenyl compounds include 3,5,3',5'-tetramethyl-4,4'-diglycidylbiphenyl. Examples of alicyclic epoxy compounds include: CELLOXIDE 2021, 2081, 2083 and 2085; EPOLEAD GT-301, GT-302, GT-401, GT-403 and EHPE-3150 (all of which are tradenames, manufactured by Daicel Chemical Industries Ltd.); and SUN TOHTO ST-3000, ST-4000, ST-5080 and ST-5100 (all of which are tradenames, manufactured by Tohto kasei Co., Ltd.). Further examples of usable epoxy compounds include: 1,1,2,2-tetrakis(p-glycidyloxyphenyl)ethane; tris(p-glycidyloxyphenyl)methane; triglycidyl tris(hydroxyethyl)isocyanurate; o-phthalic acid diglycidyl ester; terephthalic acid diglycidyl ester; EPOTOHTO YH-434 and YH-434L, which are amine-type epoxy resins; and glycidyl esters in which a bisphenol A epoxy resin has modification by a dimer acid within a skeleton thereof.

Surfactant

The pigment dispersion composition of the invention preferably includes any of various surfactants from the viewpoint of improving coating properties. Examples of surfactants that can be used include fluorine-containing surfactants, nonionic surfactants, cationic surfactants, and anionic surfactants. Of these, fluorine-containing surfactants and nonionic surfactants are preferable.

Particularly referable examples of nonionic surfactants include nonionic surfactants such as polyoxyethylene alkyl ethers, polyoxyethylene alkyl aryl ethers, polyoxyethylene alkyl esters, sorbitan alkyl esters, and monoglyceride alkyl esters. Specific examples of nonionic surfactants include: polyoxyethylene alkyl ethers such as polyoxyethylene lauryl ether, polyoxyethylene stearyl ether, and polyoxyethylene oleyl ether; polyoxyethylene aryl ethers such as polyoxyethylene octylphenyl ether, polyoxyethylene polystyrylated ether, polyoxyethylene tribenzylphenyl ether, polyoxyethylene-propylene polystyryl ether, and polyoxyethylene nonylphenyl ether; and polyoxyethylene dialkyl esters such as polyoxyethylene dilaurate and polyoxyethylene distearate; sorbitan fatty acid esters; polyoxyethylene sorbitan fatty acid esters; and ethylenediamine polyoxyethylene-polyoxypropylene condensates. Commercially-available products of these nonionic surfactants, which are available from Kao Corporation, NOF Corporation, Takemoto Oil & Fat Co., Ltd., ADEKA Corporation, Sanyou Chemical Industries Co., Ltd. and the like, may be suitably used. Aside from the above, the dispersants described above are also usable as surfactants.

Adhesion Improver

An adhesion improver may be incorporated into the colored curable composition in order to improve the adhesiveness between a hard surface such as of a support and a cured coating film formed. Examples of the adhesion improver include a silane coupling agent and a titanium coupling agent.

Examples of the silane coupling agent include γ-(2-aminoethyl)aminopropyl trimethoxysilane, γ-(2-aminoethyl)aminopropyl dimethoxysilane, β-(3,4-epoxycyclohexyl)ethyl trimethoxysilane, γ-aminopropyl trimethoxysilane, γ-aminopropyl triethoxysilane, γ-methacryloxypropyl trimethoxysilane, γ-methacryloxypropyl triethoxysilane, γ-acryloxypropyl trimethoxysilane, γ-acryloxypropyl triethoxysilane, γ-isocyanatopropyl trimethoxysilane, γ-isocyanatopropyl triethoxysilane, N-β-(N-vinylbenzylaminoethyl)-γ-aminopropyl trimethoxysilane hydrochloride, γ-glycidoxypropyl trimethoxysilane, γ-glycidoxypropyl triethoxysilane, aminosilane, γ-mercaptopropyl trimethoxysilane, γ-mercaptopropyl triethoxysilane, methyl trimethoxysilane, methyl triethoxysilane, vinyl triacetoxysilane, γ-chloropropyl trimethoxysilane, hexamethyl disilazane, γ-anilinopropyl trimethoxysilane, vinyl trimethoxysilane, vinyl triethoxysilane, vinyl tris(β-methoxyethoxy)silane, octadecyldimethyl [3-(trimethoxysilyl)propyl]ammonium chloride, γ-chloropropylmethyl dimethoxysilane, γ-mercaptopropylmethyl dimethoxysilane, methyltrichlorosilane, dimethyldichlorosilane, trimethylchlorosilane, 2-(3,4-epoxycyclohexyl)ethyl trimethoxysilane, bisallyl trimethoxysilane, tetraethoxysilane, bis(trimethoxysilyl)hexane, phenyl trimethoxysilane, N-(3-acryloxy-2-hydroxypropyl)-3-aminopropyl triethoxysilane, N-(3-methacryloxy-2-hydroxypropyl)-3-aminopropyl triethoxysilane, (methacryloxymethyl)methyl diethoxysilane, and (acryloxymethyl)methyl dimethoxysilane.

Among these, γ-methacryloxypropyl trimethoxysilane, γ-methacryloxypropyl triethoxysilane, γ-acryloxypropyl trimethoxysilane, γ-acryloxypropyl triethoxysilane, γ-mercaptopropyl trimethoxysilane, γ-aminopropyl triethoxysilane, and phenyl trimethoxysilane are preferable, and γ-methacryloxypropyl trimethoxysilane is most preferable.

The amount of adhesion improver to be added is preferably from 0.1% by mass to 30% by mass, and more preferably from 0.5% by mass to 20% by mass, relative to the total solids content of the colored curable composition.

Other Additives

Apart from the above, various additives may be incorporated into the colored curable composition of the invention. Specific examples of additives include UV absorbers such as 2-(3-t-butyl-5-methyl-2-hydroxyphenyl)-5-chlorobenzotriazole and alkoxybenzophenone, aggregation inhibitors such as sodium polyacrylate, and fillers such as glass and alumina, itaconic acid copolymers, crotonic acid copolymers, maleic acid copolymers, partially-esterified maleic acid copolymers, acidic cellulose derivatives, a product obtained by addition of an acid anhydride to a polymer having a hydroxyl group, alcohol-soluble nylon, and alkali-soluble resins such as a phenoxy resin formed from bisphenol A and epichlorohydrin.

An organic carboxylic acid, preferably a low-molecular organic carboxylic acid having a molecular weight of 1,000 or less, may be added during preparation of a pigment dispersion liquid containing the (D) pigment, with a view to increasing the alkali-solubility of uncured portions and further improving the developability of the pigment dispersion composition. Specific examples of the organic carboxylic acid include: aliphatic monocarboxylic acids such as formic acid, acetic acid, propionic acid, butyric acid, valeric acid, pivalic acid, capronic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cuminic acid, hemellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenylacetic acid, hydroatropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

In the invention, known additives may be incorporated, such as inorganic fillers for improving the physical properties of the cured film, plasticizers, and lipophilizing agent for improving ink spotting properties of the photosensitive layer surface.

Examples of plasticizers include dioctyl phthalate, didodecyl phthalate, triethyleneglycol dicaprylate, dimethylglycol phthalate, tricresyl phosphate, dioctyl adipate, dibutyl sebacate, and triacetylglycerin. In a case in which a binding agent is used, the amount of plasticizer is 10% by mass or less relative to the total mass of the binding agent and compounds having an ethylenic unsaturated double bond.

The colored curable composition of the invention cures at high sensitivity, and has excellent storage stability. Further, the colored curable composition exhibits high adhesiveness to a hard material surface, such as a support (substrate), to which the colored curable composition is applied. Therefore, the colored curable composition of the invention can be used favorably in the fields of image forming materials such as three-dimensional optical molding, holography, and color filters, inks, paints, adhesives, and coating agents.

Method of Preparing Colored Curable Composition of the Invention

The colored curable composition of the invention can be prepared by:

preparing a mixture which contains the (A) specific polymer, the (B) photopolymerization initiator, the (C) polymerizable compound, the (D) pigment, the (E) dispersant containing a phosphoric acid group, and, optionally, an alkali-soluble resin (binder polymer), and which preferably further contains a solvent;

optionally mixing the mixture with at least one additive such as a surfactant; and conducting a mixing and dispersing process in which the resultant mixture is subjected to mixing and dispersing using any of various mixers and dispersers.

The mixing and dispersing process is preferably composed of kneading-dispersing and finely-dispersing treatment that follows the kneading-dispersing. However, kneading-dispersing may be omitted.

Color Filter

The color filter of the invention is formed using the colored curable composition of the invention.

For example, the color filter is configured to have a colored pattern of one or more colors (preferably three or four colors) formed from the colored curable composition of the invention, on the support described below.

Since the color filter of the invention is formed from the colored curable composition having excellent coating film uniformity and excellent surface planarity, further having excellent developability, and capable of forming a high-resolution colored pattern, a high resolution can be obtained.

The color filter of the invention may be a color filter for a liquid crystal display or a color filter for a solid-state imaging device. From the viewpoint of high resolution, the color filter is preferably a color filter for a solid-state imaging device.

The size (line width) of the colored pattern (colored pixels) forming the color filter of the invention is preferably 2.0 µm or less, and particularly preferably 1.7 µm or less, from the viewpoint of high resolution.

The film thickness of the colored pattern is preferably from 0.1 to 2.0 µm, and more preferably from 0.2 to 1.0 µm, from the viewpoint of high resolution.

It is preferable from the viewpoint of high resolution that the color filter of the invention includes a colored pattern having a Bayer arrangement (hereinafter also referred to as "Bayer pattern").

In the invention, Bayer arrangement refers to an arrangement in which plural squares are arranged in a checkered pattern (for example, the arrangement indicated by black color in FIG. 1). The Bayer arrangement is applied to, for example, an arrangement of green pixels in a color filter for a solid-state imaging device.

The method whereby the color filter of the invention is produced is not particularly limited, and the color filter of the invention may be suitably prepared by using the below-described method of producing a color filter according to the invention.

Method of Producing Color Filter

The method whereby the color filter of the invention is produced is not particularly limited, and the below-described method of producing a color filter according to the invention is preferable.

Specifically, the method of producing a color filter according to the invention includes:

forming a colored layer by applying the colored curable composition of the invention onto a support (colored layer formation process);

exposing the colored layer to light (light exposure process); and developing the colored layer after light exposure (development process).

Individual processes of the production method of the invention are described below.

Colored Layer Formation Process

The colored layer formation process is a process of forming a colored layer by:

applying the colored curable composition of the invention onto a support directly or with at least one other layer therebetween by, for example, slit coating; and optionally drying the coating film formed by the applying.

Examples of the support include: alkali-free glass, soda glass, PYREX (registered trademark) glass, quartz glass and materials obtained by attaching a transparent conductive film to these glasses, which are used in liquid crystal display devices and the like; photoelectric conversion device substrates such as silicon substrates, which are used in solid-state imaging devices; and plastic substrates. Usually, a black matrix that separates the respective pixels is formed on the support, and/or a transparent resin layer is formed on the support in order to, for example, improve adhesion.

A surface of a plastic substrate is preferably provided with a gas barrier layer and/or a solvent-resistance layer. Other than that, a patterned film formed from the colored curable composition of the invention may be formed on a drive substrate on which thin-film transistors (TFTs) are disposed, of a thin film transistor (TFT)-system color liquid crystal display apparatus (hereinafter referred to as "substrate for TFT-system liquid crystal driving"), so as to form a color filter. The photomask used therefor is provided with a pattern for forming a through hole or a U-shaped depression as well as a pattern for forming pixels. Examples of the substrate of a substrate for TFT-system liquid crystal driving include glass, silicon, polycarbonate, polyester, aromatic polyamide, polyamidoimide and polyimide. The substrate may be a substrate that has been subjected to an appropriate pre-treatment, as desired, such as a treatment with a chemical agent such as a silane coupling agent, a plasma treatment, ion plating, sputtering, a gas-phase reaction method or vacuum deposition. Examples thereof include a substrate obtained by forming a passivation film, such as a silicon nitride film, over a surface of a substrate for TFT-system liquid crystal driving or on a surface of the drive substrate.

Even in a case in which the colored curable composition of the invention is applied onto a substrate having irregularities, the coating film formed has excellent uniformity and excellent smoothness. From the viewpoint of exerting the effects more effectively, the support to be used in the invention is preferably a substrate having irregularities on a surface thereof.

Examples of the substrate include the above-described glass substrates, silicon substrates, and plastic substrates. Examples of the irregularities include various patterns such as of thin-film transistors, photoelectric conversion elements, and passivation films. The irregularities may be another colored pattern that has already been provided on a substrate prior to the formation of a colored pattern by the method of producing a color filter according to the invention, such as the colored pattern of the n-th color described below.

The method whereby the colored curable composition of the invention is applied onto a support is not particularly limited, and known coating methods such as spin coating, slit coating, cast coating, roll coating, and bar coating may be used. Among them, slit coating is preferable.

Slit coating is a method using a slit nozzle (hereinafter referred to as "slit nozzle coating method") such as a slit-and-spin method or a spinless coating method.

Of the slit nozzle coating methods, the conditions of the slit-and-spin coating method and the spinless coating method may vary with the size of the substrate on which coating is to be performed. For example, in the case of coating on a fifth-generation glass substrate (1,100 mm×1,250 mm) by a spinless coating method, the amount of the colored curable composition ejected from the slit nozzle is usually from 500 to 2,000 microliters/second, and preferably from 800 to 1,500 microliters/second, and the coating speed is usually from 50 to 300 mm/second, and preferably from 100 to 200 mm/second. The solids content of the colored curable composition is usually from 10% to 20%, and preferably from 13% to 18%. In the case of forming a coating film from the colored curable composition of the invention on a substrate, the thickness of the coating film (after prebaking treatment) is generally from 0.3 to 5.0 µm, desirably from 0.5 to 4.0 µm, and most desirably from 0.8 to 3.0 µm.

In the case of applying the colored curable composition of the invention to formation of a color filter for a high-resolution solid-state imaging device, the thickness of the film is most preferably from 0.4 to 2.0 µm.

The colored curable composition of the invention is particularly effective for formation of a thin colored film having a thickness of, for example, from 0.4 to 1.0 µm, or from 0.45 to 0.8 µm.

Prebaking treatment is usually performed after coating. Vacuum treatment may be performed before prebaking, if necessary. The conditions of the vacuum drying may be such that the degree of vacuum is usually from 0.1 ton to 1.0 ton, and preferably approximately from 0.2 ton to 0.5 ton.

The prebaking treatment may be conducted using a hot plate, oven or the like, at a temperature range of from 50° C. to 140° C., preferably at from 70° C. to 110° C., for from 10 seconds to 300 seconds. High-frequency treatment or the like may be used in combination with the prebaking treatment. High-frequency treatment may alternatively be used alone.

Light Exposure Process

In the light exposure process, the colored layer formed through the colored layer formation process is exposed to light (preferably patternwise exposed to light). The patternwise exposure to light may be conducted by a method of exposing to light through a mask having a predetermined mask pattern or by scanning light exposure using a laser or the like.

In the light exposure in the present process, patternwise exposure of the coating film to light is conducted through a predetermined mask pattern so as to cure only portions of the coating film that have been irradiated with the light. Thereafter, development with a developer liquid is conducted so as to remove uncured portions, as a result of which a colored pattern is formed (development process). These operations are repeated for respective colors (three colors or four colors), thereby forming patterned films composed of pixels of respective colors.

A UV radiation, such as g line or i line, is preferable as a radiation that can be used in the light exposure. The irradiation dose is preferably from 5 to 1,500 mJ/cm$^2$, more preferably from 10 to 1,000 mJ/cm$^2$, and most preferably from 10 to 500 mJ/cm$^2$.

In the case of using the color filter of the invention in a liquid crystal device, within the above range, a range of from 2 to 200 mJ/cm$^2$ is preferable, a range of from 10 to 150 mJ/cm$^2$ is more preferable, and a range of from 10 to 100 mJ/cm$^2$ is most preferable.

In the case of using the color filter of the invention in a solid-state imaging device, within the above range, a range of from 30 to 1,500 mJ/cm$^2$ is preferable, a range of from 50 to 1,000 mJ/cm$^2$ is more preferable, and a range of from 80 to 500 mJ/cm$^2$ is most preferable.

In the case of producing a color filter for a solid-state imaging device, it is preferable to use mainly i line in a stepper exposure device since high precision pattern formation is required.

Development Process

The development process in the invention is a process of developing (conducting development treatment on) the colored layer that has been exposed to light.

In the development process, uncured portions after light exposure are dissolved in a developer liquid, thereby leaving only cured portions. A development temperature of from 20° C. to 30° C. is usually preferable, and the development time is preferably from 20 seconds to 90 seconds.

The developer liquid may be any developer as long as the developer liquid dissolves a coating film of the photocurable composition in uncured portions but does not dissolve cured portions. Specifically, various combinations of organic solvents, and alkaline aqueous solutions are usable.

Examples of the organic solvents include the above-described solvents that can be used in the preparation of the pigment dispersion composition or colored curable composition of the invention.

Examples of the alkaline aqueous solutions include an alkaline aqueous solution in which an alkaline compound is dissolved at a concentration of from 0.001 to 10% by mass, preferably from 0.01 to 1% by mass, and examples of the alkaline compound include sodium hydroxide, potassium hydroxide, sodium carbonate, sodium hydrogen carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene. A water-soluble organic solvent such as methanol or ethanol, a surfactant or the like may be added in an appropriate amount into the alkaline aqueous solution.

The development method may be any method such as a dip method, a shower method or a spray method, and a swing method, a spin method, a ultrasonic method or the like may be combined therewith. The face to be developed may be moistened with water or the like in advance of contact with a developer liquid, so as to prevent development unevenness. The development may be conducted while the substrate is inclined.

Puddle development may be employed in the case of producing a color filter for a solid-state imaging device.

After the development treatment, a rinse process whereby excess developer liquid is removed by washing is conducted, and drying is performed, and, thereafter, a heating treatment (postbaking) is conducted so as to perfect the curing.

The rinse process is conducted usually with pure water. However, it is permissible to use pure water at final washing but use used pure water at initial stages of washing, for the purpose of saving water. It is also permissible to perform washing while the substrate is inclined. Ultrasonic wave irradiation may be employed additionally.

After rinsing, draining and drying are performed. Thereafter, a heating treatment at, usually, from about 200° C. to about 250° C. is performed. The heating treatment (postbaking) may be conducted on the coating film after development, in a continuous manner or batch manner using a heating means such as a hot plate, a convection oven (hot air circulation dryer) or a high-frequency heating apparatus such that the above conditions are satisfied.

A color filter formed from colored cured films of plural colors can be produced by sequentially repeating the above operations for each color in accordance with the desired number of hues.

Although the above descriptions focus on mainly color filter applications as applications of the colored curable composition, the colored curable composition may be applied to formation of a black matrix that isolates the respective colored pixels forming a color filter from each other.

The black matrix can be formed by light-exposing and developing a pigment dispersion composition of the invention that contains a black pigment, such as carbon black or titanium black, as a pigment, and thereafter optionally further performing postbaking so as to promote curing of the film.

The colored curable composition of the invention exerts excellent coating uniformity and excellent flexibility of a coating film even when the substrate has irregularities, and the colored curable composition cures at high sensitivity and exhibits excellent developability. Therefore, in a case in which plural fine patterns are formed sequentially, a subsequently formed colored pattern exhibits excellent film thickness uniformity and excellent pattern forming properties, and thus colored patterns of plural colors can be formed sequentially at high resolutions. The colored curable composition is useful in, particularly, formation of a colored pattern (colored pixels) of a color filter, and can be applied to various applications.

From the viewpoints described above, the following embodiment is a particularly preferable as a method of forming the color filter of the invention.

Specifically, in the embodiment, the colored layer formation process is a process including forming at least one colored layer by applying at least one colored curable composition for forming at least one colored pattern for a (n+1)-th color (n representing an integer of 1 or greater, and the same applies hereinafter) and subsequent colors if any, on the colored pattern formation side of a support on which at least a colored pattern for a n-th color (n representing an integer of 1 or greater, and the same applies hereinafter) has been formed, such that the at least one colored curable composition is superposed on the already-formed colored pattern, wherein each of the at least one colored curable composition is the colored curable composition described above. In this embodiment, the at least one colored layer that is applied to be superposed on the already-formed colored pattern is exposed to light and developed, thereby forming the colored pattern for the (n+1)-th color and subsequent colors if any.

According to this embodiment, the colored curable composition for the colored pattern for the (n+1)-th color exhibits excellent coating uniformity and excellent developability even in a case in which a colored pattern for the n-th color has been formed on the support (that is, even in a case in which irregularities are present on the substrate). Therefore, production of a color filter having higher resolution is made possible.

Within the scope of the above embodiment, the following embodiments (1) and (2) are preferable.

(1) Forming a colored layer by applying a colored curable composition for forming a colored pattern for a second color onto the colored pattern formation side of a support on which a colored pattern for a first color has been formed such that the applied colored curable composition is superposed on the already-formed colored pattern for the first color, exposing the formed colored layer to light, and developing the colored layer, thereby forming a colored pattern for the second color, wherein the colored curable composition is the above-described colored curable composition.

(2) Forming a colored layer by applying a colored curable composition for forming a colored pattern for a third color onto the colored pattern formation side of a support on which colored patterns for a first color and a second color have been formed such that the applied colored curable composition is superposed on the already-formed colored patterns for the first and second colors, exposing the formed colored layer to light, and developing the colored layer, thereby forming a colored pattern for the third color, wherein the colored curable composition is the above-described colored curable composition.

Solid-State Imaging Device

The solid-state imaging device of the invention has the color filter of the invention.

Since the solid-state imaging device of the invention has the color filter of the invention having high resolution, the solid-state imaging device has excellent color properties.

The configuration of the solid-state imaging device of the invention is not particularly limited as long as the solid-state imaging device has a configuration that has the color filter of the invention and that functions as a solid-state imaging device. Examples of the configuration include the following configurations.

In one configuration, the solid state imaging device includes:

plural photodiodes constituting light receiving areas of a solid-state imaging device (such as a CCD image sensor or a CMOS image sensor) and transfer electrodes made of polysilicon or the like provided on a support;

a light-shielding film made of tungsten or the like provided on the photodiodes and the transfer electrodes such that only light receiving portions of the photodiodes are uncovered;

a device protection film made of silicon nitride or the like provided on the light-shielding film so as to cover the entire surface of the light-shielding film and the light receiving portions of the photodiodes; and the color filter of the invention provided on the device protection film.

A light gathering means (e.g., microlens, the same applies in the following description) may be provided on the device protection layer such that the light gathering means is positioned under the color filter (i.e., positioned at a side of the color filter that is nearer to the support). Alternatively, the light gathering means may be provided on the color filter.

EXAMPLES

The invention is described in more details below by reference to examples. However, the invention is not limited to the examples. In the following, "part(s)", "%", and "molecular weight" refer to "part(s) by mass", "% by mass", and "weight average molecular weight", respectively, unless indicated otherwise.

(A) Synthesis of Specific Polymer 43.4 parts of 1-methoxy-2-propanol were put in a reaction vessel, and the internal temperature of the reaction vessel was raised to 87° C. by heating while nitrogen gas was introduced into the reaction vessel. At that temperature, a mixture of 27.9 parts of M5300 (tradename, manufactured by TOAGOSEI CO., LTD.), 30.0 parts of benzyl methacrylate, 43.4 parts of 1-methoxy-2-propanol, and 1.8 parts of V-601 (tradename, manufactured by Wako Pure Chemical Industries, Ltd.) as a polymerization initiator were dropwise added thereto over two 2 hours, thereby causing a polymerization reaction.

After completion of the dropwise addition, 0.8 parts of V-601 were further added thereto, and the resultant was agitated for 2 hours, and the temperature thereof was raised to 90° C. to be heated for further 1 hour. As a result, a specific polymer J-1 having a weight average molecular weight of 19,000 and an acid value of 90.2 mgKOH/g was obtained.

Specific polymers J-2 to J-10 were synthesized by changing the monomer species appropriately.

The structures of the specific polymers J-1 to J-10 are described below.

Preparation of Silicon Substrate Having Undercoat Layer

The ingredients of the following composition (1) were mixed to cause dissolution, thereby preparing a resist liquid for an undercoat layer.

| Composition (1) | |
|---|---|
| Propyleneglycol monomethyl ether acetate (solvent, hereinafter sometimes referred to as "PGMEA"): | 19.20 parts |
| Ethyl lactate: | 36.67 parts |
| Binder polymer (40% PGMEA solution of benzyl methacrylate/hydroxyethyl methacrylate/ methacrylic acid (in a molar ratio of 40/40/20)): | 30.51 parts |
| Dipentaerythritol hexaacrylate: | 12.20 parts |
| Polymerization inhibitor (p-methoxyphenol): | 0.0065 parts |
| Fluorine-containing surfactant (F-475, tradename, manufactured by Dainippon Ink and Chemicals Inc.): | 0.80 parts |
| Photopolymerization initiator (I-1, having the following structure): | 0.50 parts |

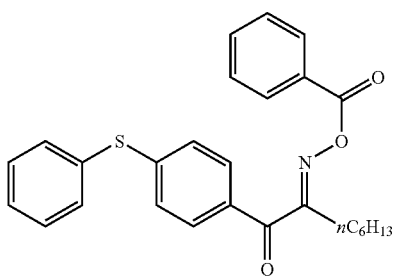
I-1

An 8-inch silicon wafer was subjected to heating treatment in an oven at 200° C. for 30 minutes. Then, the resist liquid (the resist liquid for an undercoat layer) described above was applied onto the silicon wafer such that dry film thickness would be 2 μm, and the resist liquid was dried by heating in an oven at 220° C. for 1 hour, thereby forming an undercoat layer. As a result, a silicon wafer substrate having an undercoat layer was obtained.

Preparation of Pigment Dispersion Liquid for First Colored Pattern

The ingredients of the following composition (2) were mixed, and further mixed by stirring using a homogenizer at a rotation number of 3,000 r.p.m. for 3 hours, thereby preparing a mixed solution (G) containing pigments.

| Composition (2) | |
| --- | --- |
| C. I. Pigment Green 36: | 50 parts |
| C. I. Pigment Yellow 139: | 50 parts |
| Acrylic resin solution (20 mass % solution of benzyl methacrylate/methacrylic acid (60/40 mass %) in propyleneglycol methyl ether acetate): | 200 parts |
| SOLSPERSE 32000GR (tradename, manufactured by Lubrizol Japan Ltd.; polyester dispersant): | 20 parts |
| Solvent (propyleneglycol methyl ether acetate): | 520 parts |
| Sulfonic acid-modified copper phthalocyanine shown below: | 5 parts |
| Cu-pc-(SO$_3$H)$_4$ (Cu-pc representing copper phthalocyanine) | |

Subsequently, the following ingredient was added to the mixed solution (G) obtained above, and the resultant was subjected to fine dispersing treatment for one day using a sand mill, as a result of which a pigment dispersion liquid (G) as a pigment dispersion liquid for a first colored pattern was obtained.

| | |
| --- | --- |
| Solvent (PGMEA): | 350 parts |

Preparation of Colored Curable Composition for First Colored Pattern

The following ingredients were further added to the pigment dispersion liquid (G) that had been obtained by the dispersing treatment, and the resultant was subjected to mixing by stirring, thereby preparing a green colored curable composition (G) as a colored curable composition for the first colored pattern.

| | |
| --- | --- |
| Pigment dispersion liquid (G): | 100 parts |
| Dipentaerythritol hexaacrylate: | 3.8 parts |
| Polymerization initiator (I-1, having the structure shown above): | 0.5 parts |
| Benzyl methacrylate/methacrylic acid (65/35 in molar ratio, having a weight average molecular weight of 17,000; 20% PGMEA solution): | 3.5 parts |
| Surfactant (tradename: TETRONIC 150R1, manufactured by BASF): | 0.2 parts |
| Solvent (PGMEA): | 100 parts |

Formation of First Colored Pattern

The green colored curable composition solution (G) thus obtained was applied onto the 8-inch silicon substrate having an undercoat layer, thereby forming a colored layer (G) (coating film). Then, heating treatment (prebaking) was performed for 120 seconds using a hot plate at 100° C., so as to give a dry film thickness of the colored layer (G) of 0.8 μm.

Thereafter, the colored layer (G) after prebaking was patternwise exposed to light having a wavelength of 365 nm through a Bayer pattern mask having a pattern having 1.4 μm×1.4 μm regions, using an i-line stepper light exposure apparatus FPA-300015+(tradename, manufactured by Canon Inc.). The patternwise exposure to light was performed so as to provide a set of 1.4 μm×1.4 μm images as indicated by black color in FIG. 1.

Thereafter, the silicon wafer substrate having the patternwise-exposed colored layer (G) was placed on a horizontal turntable of a spin shower development machine (model DW-30, tradename, manufactured by Chemtronics Co., Ltd.), and was subjected to puddle development at 23° C. for 60 seconds using CD-2000 (tradename, manufactured by FUJI-FILM Electronics Materials Co., Ltd.), thereby forming a colored pattern on the silicon wafer substrate.

The silicon wafer substrate on which the colored pattern had been formed was fixed to the horizontal turntable by vacuum chuck. While the silicon wafer substrate was rotated by a rotation device at a rotation number of 50 r.p.m., pure water was supplied, by showering, from an ejection nozzle above the rotation center so as to conduct rinse treatment. Subsequently, the resultant was spray-dried.

Example 1

Preparation of Pigment Dispersion Liquid for Second Colored Pattern

The ingredients of the following composition (3) were mixed, and further mixed by stirring using a homogenizer at a rotation number of 3,000 r.p.m. for 3 hours, thereby preparing a mixed solution (R) containing pigments.

| Composition (3) | |
| --- | --- |
| C. I. Pigment Red 254: | 80 parts |
| C. I. Pigment Yellow 139: | 20 parts |
| (A) Specific polymer (polymer indicated in the table): | 280 parts |
| 1-Methoxy-2-propyl acetate: | 630 parts |
| Specific pigment derivative Y shown below: | 5 parts |
| (E) Specific dispersant (compound indicated in the table): | 20 parts |

Then, the mixed solution (R) thus obtained was subjected to dispersing treatment for 6 hours using a bead disperser DISPERMAT (manufactured by GETZMANN Gmbh) in which zirconia beads having a diameter of 0.3 mm were used, and thereafter further subjected to dispersing treatment at a pressure of 2,000 kg/cm³ and a flow rate of 500 g/min using a high-pressure disperser equipped with a depressurization mechanism NANO-3000-10 (tradename, manufactured by Nippon BEE Chemical Co., Ltd.). The dispersing treatment was repeated 10 times, as a result of which a red pigment dispersion liquid (R) as a pigment dispersion liquid for a second colored pattern was obtained.

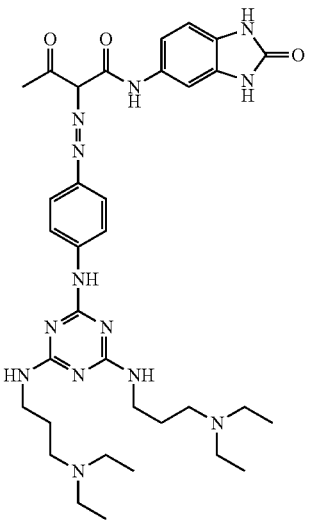

Pigment Derivative Y

Preparation of Colored Curable Composition for Second Colored Pattern

The following ingredients were further added to the pigment dispersion liquid (R) obtained by the dispersing treatment, and the resultant was mixed by stirring, thereby preparing a red colored curable composition solution (R) as a colored curable composition for the second colored pattern.

| | |
|---|---|
| Pigment dispersion liquid (R): | 100 parts |
| (C) Polymerizable compound (the compound indicated in the table): | 4.0 parts |
| (B) Photopolymerization initiator (the compound indicated in the table): | 0.5 parts |
| (A) Specific polymer (the polymer indicated in the table): | 1.0 part |
| Surfactant (TETRONIC 150R1, tradename, manufactured by BASF): | 0.2 parts |
| Solvent (PGMEA): | 100 parts |

Evaluation of Colored Curable Composition

1. Evaluation of Coating Uniformity

The colored curable composition (R) prepared in the above was applied onto the surface of the substrate (the 8-inch silicon substrate) on which the colored pattern G had previously been formed, thereby forming a colored layer (R). Then, heating treatment (prebaking) was conducted for 120 seconds using a hot plate at 100° C., so as to give a dry film thickness of the colored layer (R) of 0.8 µm.

After the application and the drying, the cross-section of the colored layer (R) was observed with a SEM S-4800 (tradename, manufactured by Hitachi High-Technologies Corporation) to determine the film thickness thereof.

It was found that the surface undulated over regions on which the colored pattern G had been formed and regions on which the colored pattern G had not been formed was observed. Film thickness was measured over the entire region of the colored layer (R) formed on the substrate, and the difference in film thickness between a portion having the greatest film thickness and a portion having the smallest film thickness was determined. The smaller this value is, the more favorable the film uniformity is. Film uniformity is rated as favorable if the difference in film thickness is 0.10 µm or less.

The results are shown in Table 1 below.

2. Evaluation of Pattern Forming Properties and Sensitivity

The colored curable composition (R) prepared in the above was applied onto the substrate having an undercoat layer (the substrate on which the colored pattern G had not been formed), thereby forming a colored layer (R). Then, heating treatment (prebaking) was conducted for 120 seconds using a hot plate at 100° C. so as to give a dry film thickness of the colored layer (R) of 0.9 µm.

Thereafter, exposure to light having a wavelength of 365 nm was performed at various exposure doses ranging from 50 to 1,600 mJ/cm² through an island pattern mask having a pattern composed of 1.4 µm×1.4 µm regions using an i-line stepper light exposure apparatus FPA-3000 i5+ (tradename, manufactured by Canon Inc.), such that an island pattern having the same size as that of the mask pattern and composed of 1.4 µm×1.4 µm regions was obtained.

Subsequently, the silicon wafer substrate having the coating film after the exposure to light was placed on a horizontal turntable of a spin shower developing machine (model DW-30, tradename, manufactured by Chemtronics Co., Ltd.), and was subjected to puddle development at 23° C. for 60 seconds using CD-2000 (tradename, manufactured by FUJIFILM Electronics Materials Co., Ltd.), thereby removing uncured portions and forming a red colored pattern R on the silicon wafer substrate.

The silicon wafer substrate on which the colored pattern R had been formed was fixed to the horizontal turntable by vacuum chuck. While the silicon wafer substrate was rotated by a rotation device at a rotation number of 50 r.p.m., pure water was supplied, by showering, from an ejection nozzle above the rotation center so as to conduct rinse treatment. Subsequently, the resultant was spray-dried.

Thereafter, the formed colored pattern composed of 1.4 µm×1.4 µm regions and areas therearound were observed at 20.000-fold magnification using a length-measuring SEM S-9260A (tradename, manufactured by Hitachi High-Technologies Corporation). Whether or not residues are present in areas that had not been exposed to light in the light exposure process (unexposed portions) was observed to evaluate developability. Developability is rated as favorable if residues are not observed.

The results are shown in Table 1.

Examples 2 to 10

Colored curable compositions were prepared in the same manner as the preparation of the colored curable composition (R) for the second colored pattern in Example 1, except that the composition was changed as shown in Table 1. The colored curable compositions obtained were evaluated in the same manner as in Example 1.

The evaluation results are shown in Table 1 below.

Comparative Examples 1 to 15

Colored curable compositions were prepared in the same manner as the preparation of the colored curable composition (R) for the second colored pattern in Example 1, except that the composition was changed as shown in Table 1. The colored curable compositions obtained were evaluated in the same manner as in Example 1.

The evaluation results are shown in Table 1 below.

In Table 1, BH-1 represents a benzyl methacrylate/methacrylic acid (75/25 in mass ratio) copolymer having a weight average molecular weight of 19,000, which is a comparative polymer.

In Table 1, PD-2, PD-3, PD-4, PD-5, and PD-A represent comparative dispersants having the structures shown below.

TABLE 1

| | (A) Specific polymer | (B) Photopolymerization initiator | (C) Polymerizable compound | (D) Pigment | | (E) Specific Dispersant | Film uniformity (μm) | Residues |
|---|---|---|---|---|---|---|---|---|
| Example 1 | J-1 | I-1 | MA-1 | PR254 | PY139 | PD-1 | 0.08 | Not present |
| Example 2 | J-2 | | | | | | 0.07 | Not present |
| Example 3 | J-3 | | | | | | 0.06 | Not present |
| Example 4 | J-4 | | | | | | 0.08 | Not present |
| Example 5 | J-5 | | | | | | 0.09 | Not present |
| Example 6 | J-6 | | | | | | 0.08 | Not present |
| Example 7 | J-7 | | | | | | 0.08 | Not present |
| Example 8 | J-8 | | | | | | 0.08 | Not present |
| Example 9 | J-9 | | | | | | 0.07 | Not present |
| Example 10 | J-10 | | | | | | 0.08 | Not present |
| Comparative Example 1 | J-1 | | | | | PD-A | 0.25 | Not present |
| Comparative Example 2 | J-2 | | | | | | 0.23 | Not present |
| Comparative Example 3 | J-3 | | | | | | 0.24 | Not present |
| Comparative Example 4 | J-4 | | | | | | 0.23 | Not present |
| Comparative Example 5 | J-5 | | | | | | 0.24 | Not present |
| Comparative Example 6 | J-6 | | | | | | 0.26 | Not present |
| Comparative Example 7 | J-7 | | | | | | 0.25 | Not present |
| Comparative Example 8 | J-8 | | | | | | 0.24 | Not present |
| Comparative Example 9 | J-9 | | | | | | 0.22 | Not present |
| Comparative Example 10 | J-10 | | | | | | 0.23 | Not present |
| Comparative Example 11 | J-7 | I-1 | MA-1 | PR254 | PY139 | PD-2 | 0.15 | Present |
| Comparative Example 12 | | | | | | PD-3 | 0.16 | Present |
| Comparative Example 13 | | | | | | PD-4 | 0.02 | Present |
| Comparative Example 14 | | | | | | PD-5 | 0.02 | Present |
| Comparative Example 15 | BH-1 | | | | | PD-A | 0.23 | Present |

The structures of compound (J-1) to compound (J-10), compound (I-1), compound (MA-1), compound (PD-1) to compound (PD-5), and compound (PD-A) described in Table 1 are as shown below.

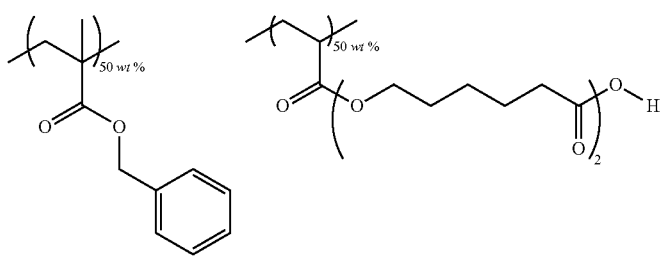

J-1

Mw = 19000

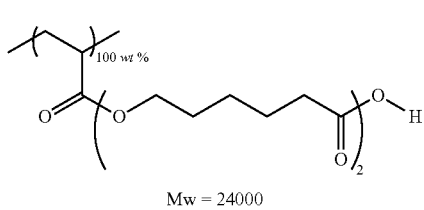

J-2

Mw = 24000

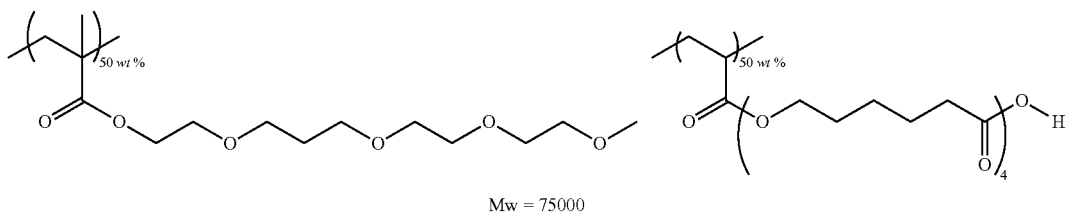
J-3
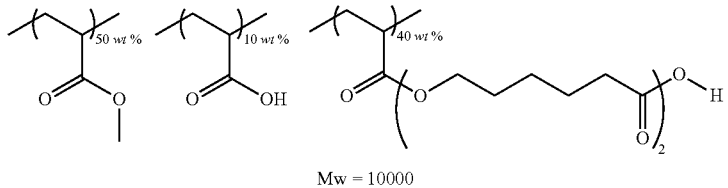
J-4
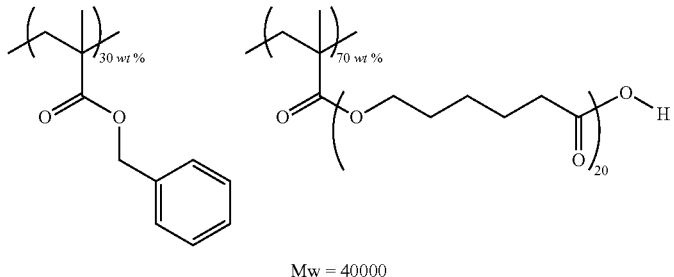
J-5
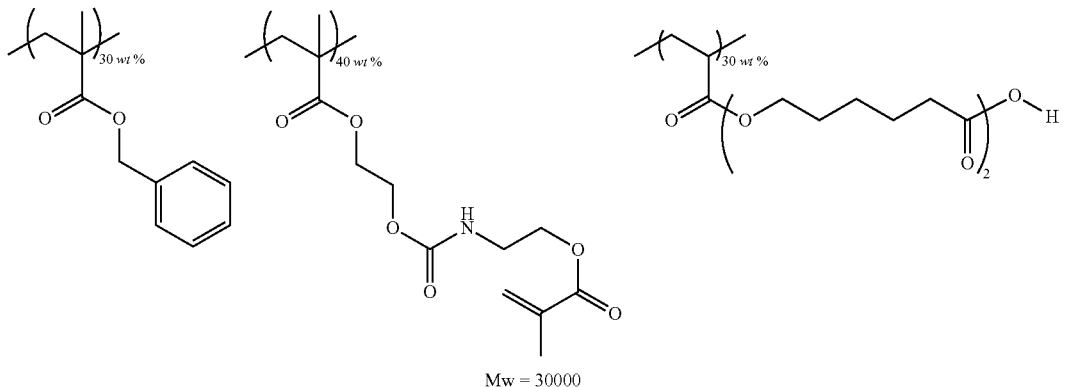
J-6
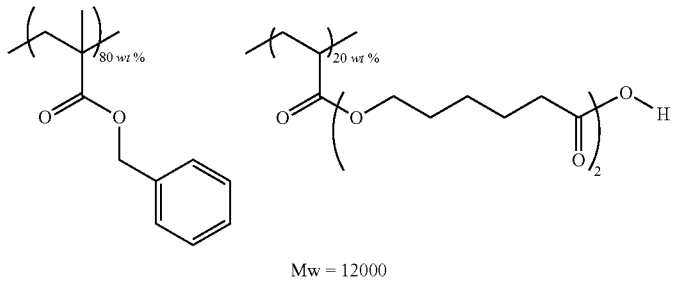
J-7

-continued
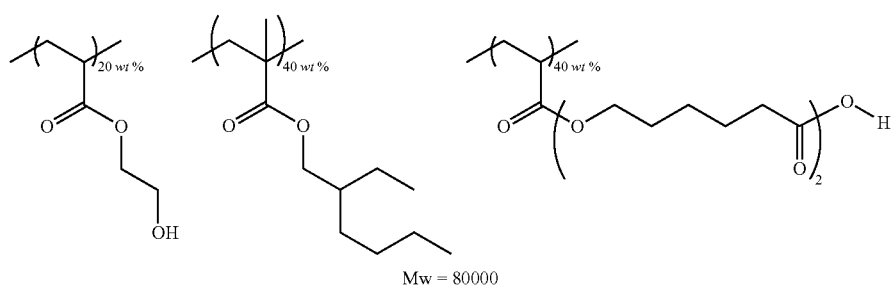
J-8
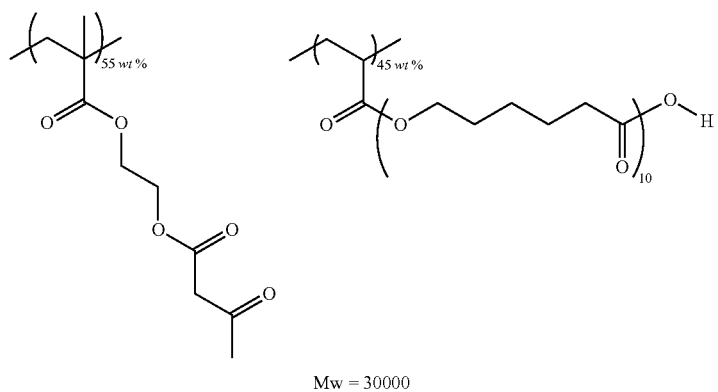
J-9
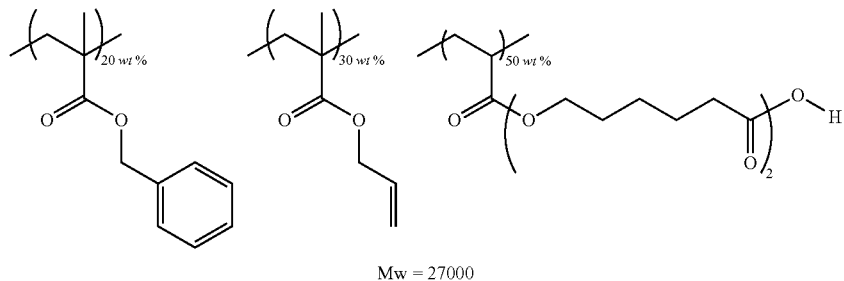
J-10
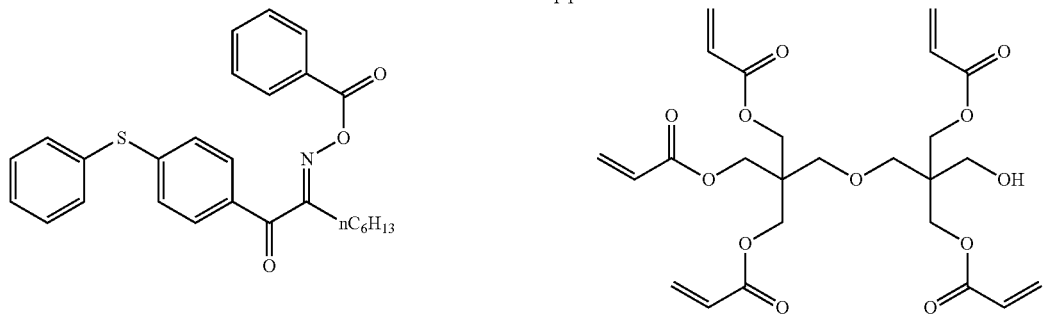
I-1    MA-1
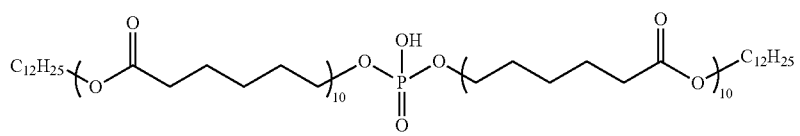
PD-1
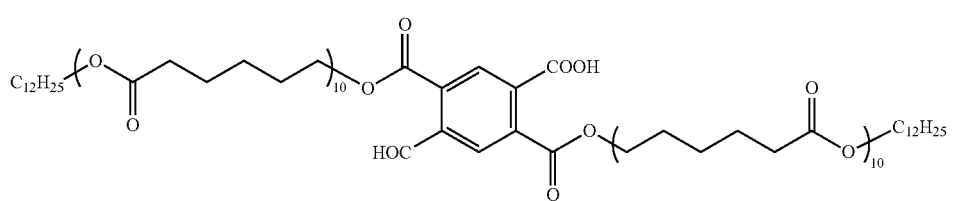
PD-A

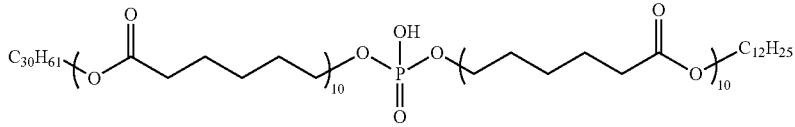
PD-2

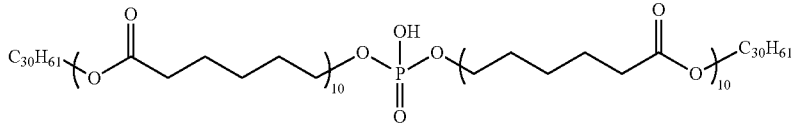
PD-3

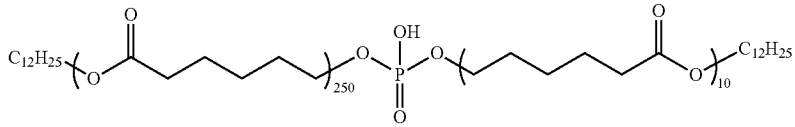
PD-4

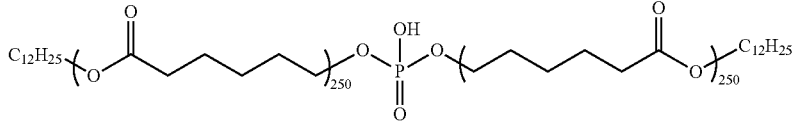
PD-5

As is apparent from Table 1, with each of the colored curable compositions of Examples 1 to 10, a coating film having a uniform film thickness could be formed even on a substrate on which a colored pattern had previously been formed and which thus had irregularities, and developability was also excellent. The Comparative Examples, in which a polymer not having the specific side chain structure and/or a dispersant not having the specific phosphoric acid structure were used, was found to be inferior in respect of film thickness uniformity.

Although specific compounds were used in the Examples described above, effects similar to those obtained in Examples 1 to 10 can be obtained as long as the configuration of the invention is satisfied, even in a case in which compounds other than the specific compounds described above are used.

In the Examples described above, each of the colored curable compositions of the Examples was applied onto a substrate on which a colored pattern for a first color (colored pattern for green color) had already been formed, thereby forming a colored layer. A colored pattern for a second color (colored pattern for red color) can be formed by exposing the formed colored layer to light and developing the colored layer.

In a similar manner, a colored pattern for a third color may be formed using the colored curable composition of the present example, on a substrate on which colored patterns for first and second colors have been formed.

A colored pattern for a fourth color may be formed using the colored curable composition of the present example, on a substrate on which colored patterns for first, second, and third colors have been formed.

At least one colored patterns for a (n+1)-th color and subsequent colors, if any, may be formed using at least one of the colored curable composition of the present example, on a substrate on which at least a colored pattern for a n-th color has been formed.

Effects similar to those obtained in Examples 1 to 10 can be obtained in any of these cases.

Although a color filter was formed on a silicon wafer in the above Examples, a solid-state imaging device having excellent color properties can be produced by replacing the silicon wafer by a substrate for a solid-state imaging device on which a light-receiving devices, such as photodiodes, have been formed.

The invention claimed is:

1. A colored curable composition comprising:
   (A) a polymer that contains a structural unit having a carboxyl group bonded to a main chain thereof via a linking group containing an ester group;
   (B) a photopolymerization initiator;
   (C) a polymerizable compound;
   (D) a pigment; and
   (E) a dispersant which is a compound represented by the following Formula (II):

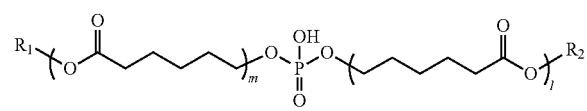

(II)

wherein, in Formula (II), $R_1$ and $R_2$ each independently represent a hydrogen atom or a hydrocarbon group having from 1 to 20 carbon atoms, and $m$ and $l$ each independently represent an integer of from 1 to 200.

2. The colored curable composition according to claim 1, wherein the (A) polymer that contains a structural unit having a carboxyl group bonded to a main chain thereof via a linking group containing an ester group is a polymer containing a structural unit represented by the following Formula (I):

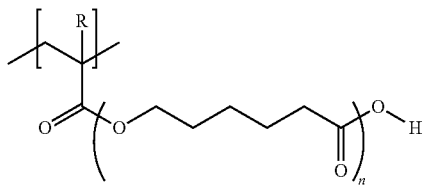

(I)

wherein, in Formula (I), R represents a hydrogen atom or a hydrocarbon group having from 1 to 4 carbon atoms, and n represents an integer of from 1 to 200.

3. The colored curable composition according to claim 2, wherein R in Formula (I) is a hydrogen atom or a methyl group.

4. The colored curable composition according to claim 2, wherein n in Formula (I) is an integer of from 1 to 100.

5. The colored curable composition according to claim 2, wherein the structural unit represented by Formula (I) is contained, at a content of from 5% by mass to 100% by mass, in the (A) polymer that contains a structural unit having a carboxyl group bonded to a main chain thereof via a linking group containing an ester group.

6. The colored curable composition according to claim 2, wherein the (A) polymer that contains a structural unit having a carboxyl group bonded to a main chain thereof via a linking group containing an ester group further comprises a structural unit other than structural units represented by Formula (I).

7. The colored curable composition according to claim 1, wherein the content of the (A) polymer that contains a structural unit having a carboxyl group bonded to a main chain thereof via a linking group containing an ester group is from 2% by mass to 50% by mass relative to the solids content of the colored curable composition.

8. The colored curable composition according to claim 1, wherein $R_1$ and $R_2$ in Formula (II) are each independently a hydrocarbon group having from 6 to 20 carbon atoms.

9. The colored curable composition according to claim 1, wherein m and l in Formula (II) are each independently an integer of from 2 to 20.

10. The colored curable composition according to claim 1, wherein the (C) polymerizable compound is a radical-polymerizable compound.

11. The colored curable composition according to claim 1, wherein the (D) pigment is contained, at a content of from 5% by mass to 90% by mass, in the colored curable composition.

12. A color filter produced using the colored curable composition of claim 1.

13. A method of producing a color filter, the method comprising:
    forming a colored layer by applying the colored curable composition of claim 1 onto a support;
    exposing the colored layer to light; and
    developing the colored layer after the exposure to light.

14. The method of producing a color filter according to claim 13, wherein the forming of the colored layer comprises forming the colored layer by applying, onto a colored pattern formation side of the support on which at least a colored pattern for a n-th color (n representing an integer of 1 or greater) is formed, at least one of the colored curable composition for forming at least one colored pattern for a (n+l)-th color (n representing an integer of 1 or greater) and subsequent colors if any, such that the at least one colored curable composition is superposed on the already-formed colored pattern.

15. A solid-state imaging device comprising the color filter of claim 12.

* * * * *